(12) United States Patent
Oh et al.

(10) Patent No.: US 12,382,745 B2
(45) Date of Patent: Aug. 5, 2025

(54) IMAGE SENSOR

(71) Applicant: SAMSUNG ELECTRONICS CO., LTD., Suwon-si (KR)

(72) Inventors: Kwanyoung Oh, Cheonan-si (KR); Mihye Kim, Hwaseong-si (KR); Donghyuk Park, Yongin-si (KR); Jiwon Park, Suwon-si (KR); Seungwook Lee, Hwaseong-si (KR); Haewon Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 718 days.

(21) Appl. No.: 17/585,777

(22) Filed: Jan. 27, 2022

(65) Prior Publication Data

US 2022/0328553 A1 Oct. 13, 2022

(30) Foreign Application Priority Data

Apr. 9, 2021 (KR) .................. 10-2021-0046201

(51) Int. Cl.
*H10F 39/00* (2025.01)
(52) U.S. Cl.
CPC ......... *H10F 39/811* (2025.01); *H10F 39/802* (2025.01); *H10F 39/805* (2025.01); *H10F 39/8063* (2025.01)
(58) Field of Classification Search
CPC ......... H01L 27/14636; H01L 27/14603; H10F 39/811; H10F 39/802; H10F 39/805; H10F 39/8063
See application file for complete search history.

(56) References Cited

U.S. PATENT DOCUMENTS

| 6,423,994 | B1 | 7/2002 | Guidash |
|---|---|---|---|
| 8,222,682 | B2 | 7/2012 | Watanabe et al. |
| 8,405,751 | B2 | 3/2013 | Hibbeler et al. |
| 9,270,915 | B2 * | 2/2016 | Kido ................. H01L 27/14625 |
| 9,508,770 | B2 | 11/2016 | Yanagita et al. |
| 10,050,073 | B2 * | 8/2018 | Ishiwata ........... H01L 27/14685 |

(Continued)

FOREIGN PATENT DOCUMENTS

| JP | 2021-005656 A | 1/2021 |
|---|---|---|
| KR | 10-2016-0022087 A | 2/2016 |
| WO | 2020262643 | 6/2020 |

*Primary Examiner* — Eugene Lee
(74) *Attorney, Agent, or Firm* — Wolf, Greenfield & Sacks, P.C.

(57) ABSTRACT

An image sensor includes a first floating diffusion region, a second floating diffusion region adjacent to the first floating diffusion region in a first direction, a third floating diffusion region adjacent to the first floating diffusion region in a second direction that is perpendicular to the first direction and a fourth floating diffusion region adjacent to the second floating diffusion region in the second direction. A pad is disposed on the first and second floating diffusion regions. The pad at least partially overlaps the first and second floating diffusion regions. The image sensor includes an interconnection line and a first contact connecting the pad to the interconnection line. A first surface of the pad is disposed on the first floating diffusion region and the second floating diffusion region. A device isolation pattern defines the first, second, third and fourth floating diffusion regions.

10 Claims, 25 Drawing Sheets

(56) References Cited

U.S. PATENT DOCUMENTS

| | | | |
|---|---|---|---|
| 10,147,758 B2 | 12/2018 | Itonaga et al. | |
| 10,192,910 B2 | 1/2019 | Ihara | |
| 10,734,431 B2 | 8/2020 | Lee | |
| 2011/0019063 A1* | 1/2011 | Watanabe | H01L 27/14603 |
| | | | 257/233 |
| 2011/0102620 A1* | 5/2011 | Sakano | H01L 27/14609 |
| | | | 348/222.1 |
| 2012/0009720 A1* | 1/2012 | Shim | H01L 27/14625 |
| | | | 257/E31.127 |
| 2016/0336364 A1* | 11/2016 | Itonaga | H01L 27/14831 |
| 2018/0083062 A1* | 3/2018 | Kato | H01L 27/14612 |
| 2018/0240826 A1* | 8/2018 | Park | H01L 27/14603 |
| 2020/0091212 A1* | 3/2020 | Park | H01L 27/14641 |
| 2020/0119064 A1* | 4/2020 | Yun | H01L 27/14627 |
| 2020/0119082 A1* | 4/2020 | Lee | H01L 27/14831 |
| 2020/0266229 A1* | 8/2020 | Takahashi | H01L 27/14616 |
| 2021/0152767 A1* | 5/2021 | Ma | H04N 25/134 |
| 2021/0167103 A1* | 6/2021 | Yanagita | H01L 27/14689 |
| 2021/0242257 A1* | 8/2021 | Lee | H01L 27/14641 |
| 2021/0250529 A1* | 8/2021 | Baek | H04N 23/843 |
| 2022/0102402 A1* | 3/2022 | Kwag | H04N 25/77 |
| 2022/0359599 A1* | 11/2022 | Iijima | H01L 27/146 |

* cited by examiner

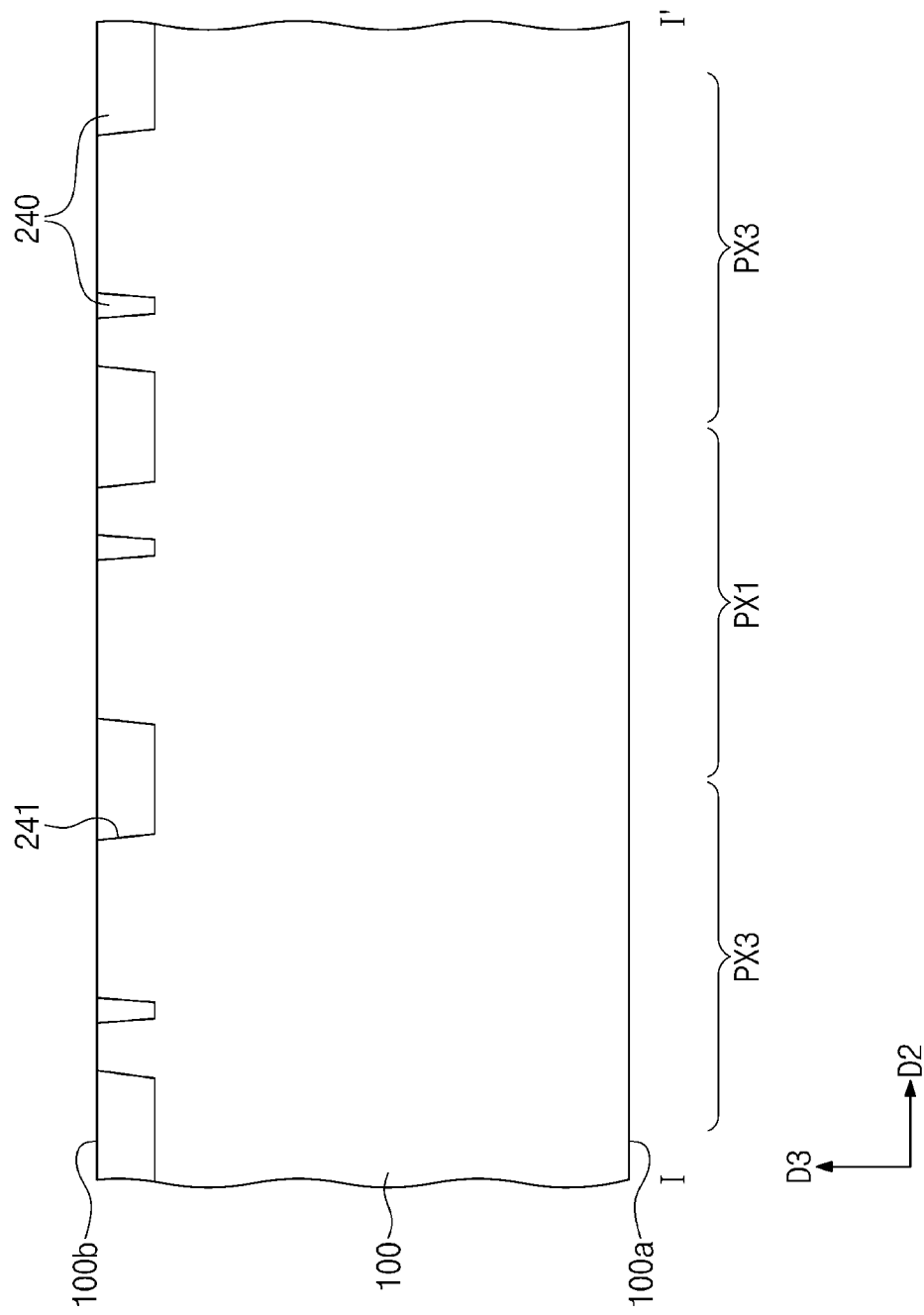

IMAGE SENSOR

CROSS-REFERENCE TO RELATED APPLICATION

This application claims priority under 35 U.S.C. § 119 to Korean Patent Application No. 10-2021-0046201, filed on Apr. 9, 2021 in the Korean Intellectual Property Office, the disclosure of which is incorporated by reference in its entirety herein.

1. TECHNICAL FIELD

Embodiments of the present inventive concept relate to an image sensor and, more particularly, to an image sensor capable of increasing a degree of freedom of routing.

2. DISCUSSION OF RELATED ART

An image sensor is a device that converts an optical image into electrical signals. Examples of image sensors include charge coupled device (CCD) image sensors and complementary metal-oxide-semiconductor (CMOS) image sensors ("CIS"). The CIS may include a plurality of pixels two-dimensionally arranged. Each of the pixels may include a photodiode (PD). The photodiode may convert incident light into an electrical signal.

SUMMARY

Embodiments of the present inventive concept may provide an image sensor capable of increasing a degree of freedom of routing.

Embodiments of the present inventive concept may also provide a method of manufacturing an image sensor capable of increasing a degree of freedom of routing.

According to an embodiment of the present inventive concept, an image sensor includes a first floating diffusion region, a second floating diffusion region adjacent to the first floating diffusion region in a first direction, a third floating diffusion region adjacent to the first floating diffusion region in a second direction that is perpendicular to the first direction and a fourth floating diffusion region adjacent to the second floating diffusion region in the second direction. A pad is disposed on the first and second floating diffusion regions. The pad at least partially overlaps the first and second floating diffusion regions. The image sensor includes an interconnection line and a first contact connecting the pad to the interconnection line. A first surface of the pad is disposed on the first floating diffusion region and the second floating diffusion region. A device isolation pattern defines the first, second, third and fourth floating diffusion regions.

According to an embodiment of the present inventive concept, an image sensor includes a circuit chip. A sensor chip is stacked on the circuit chip and is electrically connected to the circuit chip. The sensor chip includes a first substrate including a first surface and a second surface opposite to the first surface. An isolation pattern defines first to fourth pixel regions in the first substrate. Each of the first to fourth pixel regions includes a floating diffusion region, a ground region and an active region that are adjacent to the second surface. A micro lens layer is disposed on the first surface of the first substrate. A first interconnection layer is disposed on the second surface of the first substrate. A first pad is disposed between the second surface of the first substrate and the first interconnection layer. The first pad directly contacts and is connected in common to the floating diffusion regions of at least two of the first to fourth pixel regions. The first interconnection layer comprises a first interconnection line and a first contact connecting the first interconnection line and the first pad to each other. The first contact comprises first vertical extensions directly contacting the floating diffusion regions of the at least two of the first to fourth pixel regions, respectively. A first upper portion connects the first vertical extensions to each other and directly contacts a top surface of the first pad.

According to an embodiment of the present inventive concept, an image sensor includes a first floating diffusion region. A second floating diffusion region is adjacent to the first floating diffusion region in a first direction. A third floating diffusion region is adjacent to the first floating diffusion region in a second direction that is perpendicular to the first direction. A fourth floating diffusion region is adjacent to the second floating diffusion region in the second direction. An isolation structure isolates the first to fourth floating diffusion regions from each other. A pad connects the first and second floating diffusion regions to each other. The image sensor includes an interconnection line. A first contact connects the pad to the interconnection line. A first surface of the pad is disposed on the first floating diffusion region, the second floating diffusion region, and the isolation structure.

BRIEF DESCRIPTION OF THE DRAWINGS

Embodiments of the present inventive concept will become more apparent in view of the attached drawings and accompanying detailed description.

FIGS. 7 to 15 are cross-sectional views illustrating a method of manufacturing an image sensor taken along line I-I' of FIG. 5 according to some embodiments of the present inventive concept.

DETAILED DESCRIPTION OF EMBODIMENTS

Figure 1:
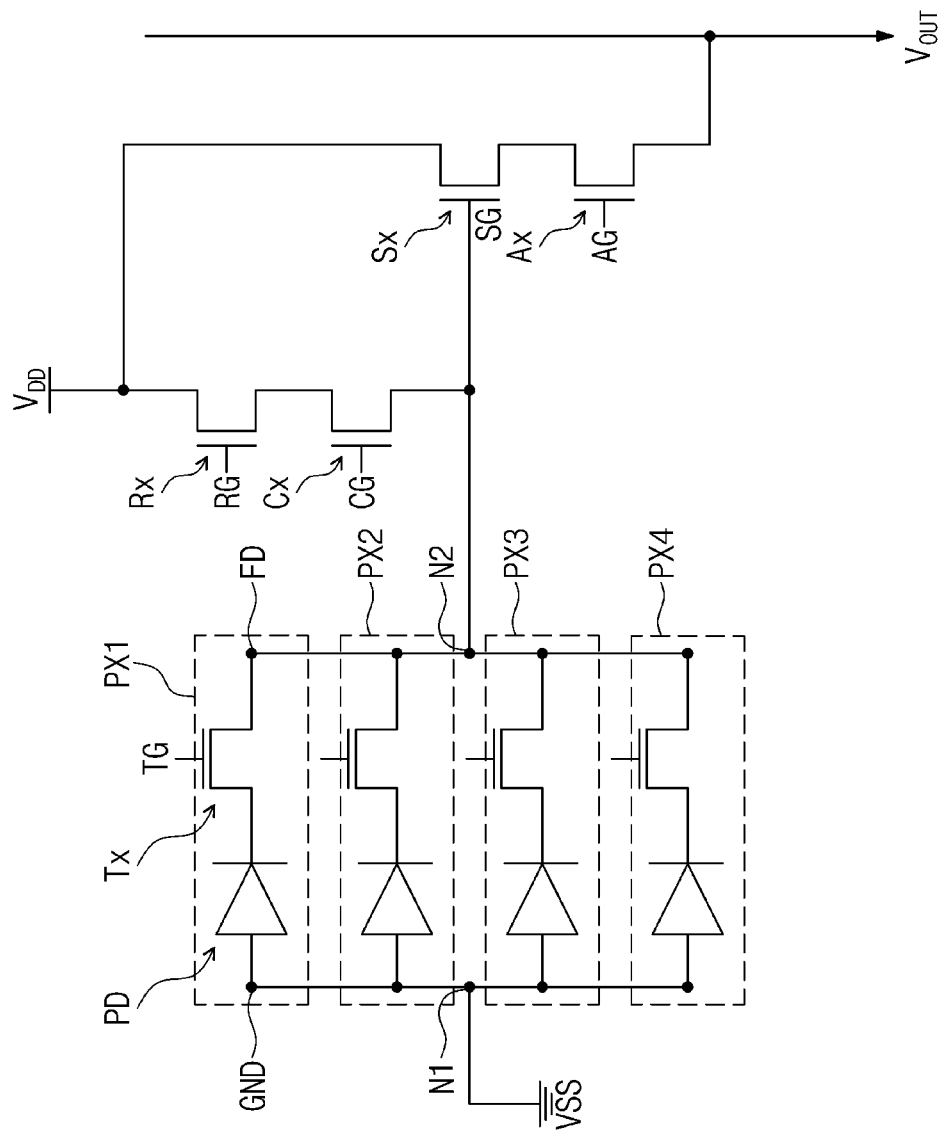
FIG. 1 is a circuit diagram of pixels of an image sensor according to an embodiment of the present inventive concept.

FIG. 1 is a circuit diagram of pixels of an image sensor according to some embodiments of the inventive concept.

Referring to FIG. 1, an image sensor may include first to fourth pixels PX1 to PX4. Each of the first to fourth pixels PX1 to PX4 may include a ground region GND, a photoelectric conversion region PD, a transfer transistor Tx, and a floating diffusion region FD.

In an embodiment, the ground region GND may include a P-type dopant region. A ground voltage VSS may be applied in common to the ground regions GND of the first to fourth pixels PX1 to PX4 through a first node N1.

In an embodiment, the photoelectric conversion region PD may be a photodiode including an N-type dopant region and a P-type dopant region. The floating diffusion region FD may include an N-type dopant region. The floating diffusion region FD may function as a drain of the transfer transistor Tx.

The floating diffusion regions FD of the first to fourth pixels PX1 to PX4 may be connected in common to a second node N2. The second node N2 to which the floating diffusion regions FD of the first to fourth pixels PX1 to PX4 are connected may be connected to a source of a conversion gain transistor Cx. The conversion gain transistor Cx may be connected to a reset transistor Rx.

The second node N2 may also be electrically connected to a source follower gate SG of a source follower transistor Sx. The source follower transistor Sx may be connected to a selection transistor Ax.

An operation of the image sensor will be described hereinafter with reference to FIG. 1. First, in a state in which light is blocked, a power voltage $V_{DD}$ may be applied to a drain of the reset transistor Rx and a drain of the source follower transistor Sx, and the reset transistor Rx may be turned-on to discharge charges remaining in the floating diffusion region FD. Thereafter, the reset transistor Rx may be turned-off, and external light may be incident to the photoelectric conversion region PD to generate electron-hole pairs in the photoelectric conversion region PD. In an embodiment, the holes may be moved into and accumulated in the P-type dopant region, and the electrons may be moved into and accumulated in the N-type dopant region. The transfer transistor Tx may be turned-on to transfer charges (e.g., the electrons or the holes) into the floating diffusion region FD. The transferred charges may be accumulated in the floating diffusion region FD. A gate bias of the source follower transistor Sx may be changed in proportion to the amount of the charges accumulated in the floating diffusion region FD, thereby causing a change in potential of a source of the source follower transistor Sx. At this time, the selection transistor Ax may be turned-on, and thus a signal generated by the charges may be sensed through a column line.

An interconnection line may be electrically connected to at least one of a transfer gate TG, the source follower gate SG, a reset gate RG, or a selection gate AG. The interconnection line may be configured to apply the power voltage $V_{DD}$ to the drain of the reset transistor Rx or the drain of the source follower transistor Sx. The interconnection line may include the column line connected to the selection transistor Ax. The interconnection line may include a first conductive structure 830 to be described later in FIG. 3.

FIG. 1 illustrates the first to fourth pixels PX1 to PX4 sharing the first node N1 and the second node N2. However, embodiments of the present inventive concept are not limited thereto.

Figure 2:
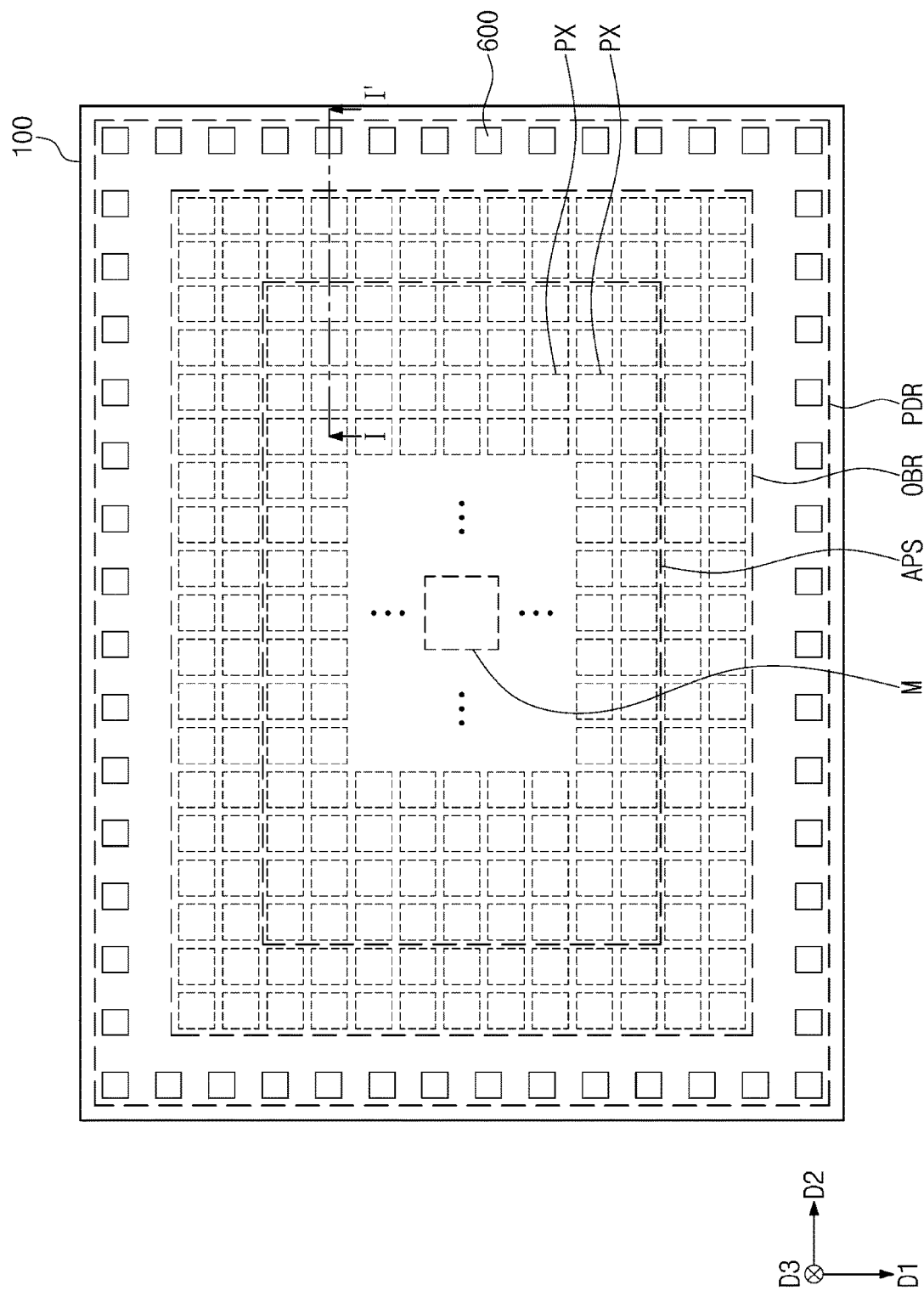
FIG. 2 is a plan view illustrating an image sensor according to according to an embodiment of the present inventive concept.
Figure 3:
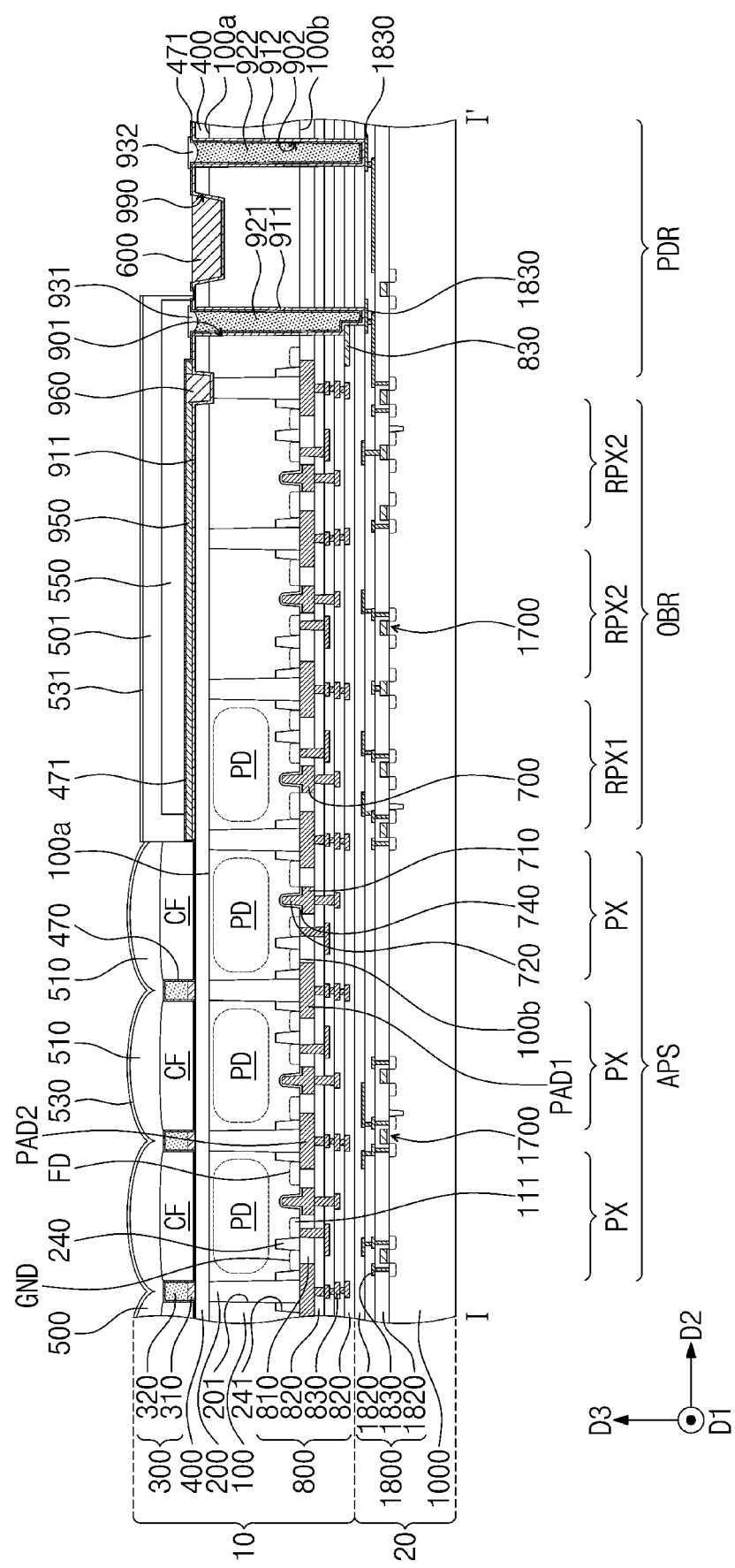
FIG. 3 is a cross-sectional view taken along line I-I' of FIG. 2 according to an embodiment of the present inventive concept.

FIG. 2 is a plan view illustrating an image sensor according to some embodiments of the present inventive concept. FIG. 3 is a cross-sectional view taken along a line I-I' of FIG. 2.

Referring to FIGS. 2 and 3, an image sensor may include a sensor chip 10. The sensor chip 10 may include a first substrate 100, a first interconnection layer 800, an insulating layer 400, a protective layer 470, color filters CF, a fence pattern 300, and a micro lens layer 500.

The first substrate 100 may include a pixel array region APS, an optical black region OBR, and a pad region PDR when viewed in a plan view (e.g., in a plane defined in the first and second directions D1, D2). In an embodiment, the pixel array region APS may be disposed in a central region of the first substrate 100 (e.g., in the first and second directions D1, D2). The pixel array region APS may include a plurality of pixel regions PX. The number of the pixel regions PX included in the pixel array region APS may vary. The pixel described with reference to FIG. 1 may be disposed in each of the pixel regions PX of the first substrate 100. For example, the components of the pixel of FIG. 1 may be disposed in each of the pixel regions PX. The pixel regions PX may output photoelectric signals from incident light.

The pixel regions PX may be two-dimensionally arranged to constitute rows and columns. In an embodiment, the rows may extend parallel to the second direction D2. The columns may extend parallel to a first direction D1. In an embodiment, the first direction D1 may be parallel to a first surface 100*a* of the first substrate 100. The second direction D2 may be parallel to the first surface 100*a* of the first substrate 100 and may intersect the first direction D1. For example, the second direction D2 may be substantially perpendicular to the first direction D1. However, embodiments of the present inventive concept are not limited thereto and the second direction D2 may cross the first direction D1 at various different angles. A third direction D3 may be perpendicular to the first direction D1 and the second direction D2. For example, the third direction D3 may be substantially perpendicular to the first surface 100*a* of the first substrate 100 and may be a thickness direction of the image sensor.

The pad region PDR may be disposed in an edge region of the first substrate 100 to surround the pixel array region APS. For example, as shown in the embodiment of FIG. 2, the pad region PDR may completely surround the pixel array regions APS (e.g., in the first and second directions D1, D2). However, embodiments of the present inventive concept are not limited thereto. External connection pads 600 may be disposed on the pad region PDR. The external connection pads 600 may output electrical signals generated from the pixel regions PX to the outside, such as to an external device. In addition, an external electrical signal or voltage may be transmitted to the pixel regions PX through the external connection pads 600, such as from an external device. Since the pad region PDR is disposed in the edge region of the first substrate 100, the external connection pads 600 may be easily connected to an external device. The optical black region OBR will be described later in detail. Hereinafter, the pixel array region APS of the sensor chip 10 of the image sensor will be described in more detail.

The first substrate 100 may have the first surface 100*a* and a second surface 100*b* which are opposite to each other (e.g., in the third direction D3). The first surface 100*a* of the first substrate 100 may be a back surface, and the second surface 100*b* of the first substrate 100 may be a front surface. Light may be incident to the first surface 100*a* of the first substrate 100. In an embodiment, the first substrate 100 may be a semiconductor substrate or a silicon-on-insulator (SOI) substrate. For example, the semiconductor substrate may include a silicon substrate, a germanium substrate, or a silicon-germanium substrate. The first substrate 100 may further include a group III element. The group III element may be dopants having a first conductivity type. For example, the first substrate 100 may have the first conductivity type (e.g., a P-type). In an embodiment, the dopants having the first conductivity type may include aluminum (Al), boron (B), indium (in), and/or gallium (Ga). However, embodiments of the present inventive concept are not limited thereto.

The first substrate 100 may include a plurality of photoelectric conversion regions PD therein. The photoelectric conversion regions PD may be positioned between the first surface 100*a* and the second surface 100*b* of the first substrate 100 (e.g., in the third direction D3). The photoelectric conversion regions PD may be disposed in the pixel regions PX of the first substrate 100, respectively. The photoelectric conversion region PD of FIG. 3 may correspond to the photoelectric conversion region PD of FIG. 1.

In an embodiment, the photoelectric conversion region PD may further include a group V element. The group V element may be dopants having a second conductivity type. For example, the photoelectric conversion region PD may be a dopant region having the second conductivity type. The second conductivity type may be an N-type different from the first conductivity type. In an embodiment, the dopants having the second conductivity type may include phosphorus, arsenic, bismuth, and/or antimony. However, embodiments of the present inventive concept are not limited thereto. The photoelectric conversion region PD may be adjacent to the first surface 100*a* of the first substrate 100. The photoelectric conversion region PD may extend from the first surface 100*a* toward the second surface 100*b* (e.g., in the third direction D3).

An isolation pattern 200 may be disposed in the first substrate 100 to define the pixel regions PX. For example, the isolation pattern 200 may be disposed between the pixel regions PX adjacent to each other. In an embodiment, the isolation pattern 200 may be a pixel isolation pattern. The isolation pattern 200 may be disposed in a first trench 201. The first trench 201 may be recessed from the second surface 100*b* toward the first surface 100*a* of the first substrate 100.

In an embodiment, the isolation pattern 200 may be a deep trench isolation (DTI) pattern. In the embodiment shown in FIG. 3, the isolation pattern 200 may fully penetrate the first substrate 100. However, embodiments of the present inventive concept are not limited thereto. For example, in some embodiments, the isolation pattern 200 may not fully penetrate the first substrate 100 but may be spaced apart from the first surface 100*a* of the first substrate 100. In an embodiment, a width of the isolation pattern 200 (e.g., length in the second direction D2) adjacent to the second surface 100*b* may be greater than a width of the isolation pattern 200 (e.g., length in the second direction D2) adjacent to the first surface 100*a*.

The color filters CF may be disposed on the first surface 100*a* of the first substrate 100 and may be disposed on the pixel regions PX, respectively. For example, in an embodiment, the color filters CF may be disposed at positions corresponding to the photoelectric conversion regions PD, respectively. In an embodiment, each of the color filters CF may include one of a red filter, a blue filter, and a green filter. The color filters CF may constitute a color filter array. For example, the color filters CF may be two-dimensionally arranged in the form of a Bayer pattern. However, embodiments of the present inventive concept are not limited thereto and the colors of the color filters CF and the arrangement of the color filters CF may vary.

The fence pattern 300 may be disposed on the isolation pattern 200. For example, the fence pattern 300 may vertically overlap (e.g., overlap in the third direction D3) with the isolation pattern 200. The fence pattern 300 may be disposed between two adjacent color filters CF to separate the color filters CF from each other. For example, the color filters CF may be physically and optically separated from each other by the fence pattern 300.

In an embodiment, the fence pattern 300 may have a planar shape corresponding to that of the isolation pattern 200. For example, the fence pattern 300 may have a grid shape. The fence pattern 300 may surround each of the pixel regions PX when viewed in a plan view (e.g., in the first and second directions D1, D2). The fence pattern 300 may surround each of the color filters CF. The fence pattern 300 may include first portions and second portions. In an embodiment, the first portions may extend parallel to the first direction D1 and may be spaced apart from each other in the second direction D2. The second portions may extend parallel to the second direction D2 and may be spaced apart from each other in the first direction D1. The second portions may intersect the first portions.

In an embodiment, the fence pattern 300 may include a first fence pattern 310 and a second fence pattern 320. The first fence pattern 310 may be disposed between the insulating layer 400 and the second fence pattern 320 (e.g., in the third direction D3). In an embodiment, the first fence pattern 310 may include a conductive material such as a metal and/or a metal nitride. For example, the first fence pattern 310 may include titanium and/or titanium nitride. However, embodiments of the present inventive concept are not limited thereto.

The second fence pattern 320 may be disposed on the first fence pattern 310 (e.g., disposed directly thereon in the third direction D3). The second fence pattern 320 may include a different material from that of the first fence pattern 310. For example, the second fence pattern 320 may include an organic material. The second fence pattern 320 may include a low-refractive index material and may have an insulating property.

The insulating layer 400 may be disposed between the first substrate 100 and the color filters CF (e.g., in the third direction D3) and between the isolation pattern 200 and the fence pattern 300 (e.g., in the third direction D3). The insulating layer 400 may cover the first surface 100*a* of the first substrate 100 and a top surface of the isolation pattern 200. The insulating layer 400 may be a backside insulating layer. In an embodiment, the insulating layer 400 may include a bottom anti-reflective coating (BARC) layer. The insulating layer 400 may include a plurality of layers, and the layers of the insulating layer 400 may perform different functions.

In some embodiments, the insulating layer 400 may include a first insulating layer, a second insulating layer, a third insulating layer, a fourth insulating layer and a fifth insulating layer, which are sequentially stacked on the first surface 100a of the first substrate 100 (e.g., in the third direction D3). The first insulating layer may directly cover the first surface 100a of the first substrate 100. In an embodiment, the first and second insulating layers may be fixed charge layers. Each of the fixed charge layers may be formed of a metal oxide layer or a metal fluoride layer. The metal oxide layer may include insufficient oxygen in terms of a stoichiometric ratio, and the metal fluoride layer may include insufficient fluorine in terms of a stoichiometric ratio.

For example, in an embodiment, the first insulating layer may be formed of a metal oxide layer or metal fluoride layer including at least one metal selected from a group consisting of hafnium (Hf), zirconium (Zr), aluminum (Al), tantalum (Ta), titanium (Ti), yttrium (Y), and a lanthanoid. The second insulating layer may include the metal oxide layer or metal fluoride layer described as the examples of the first insulating layer. However, the second insulating layer may include a different material from that of the first insulating layer. For example, the first insulating layer may include an aluminum oxide layer, and the second insulating layer may include a hafnium oxide layer.

Each of the first and second insulating layers may have negative fixed charges and may accumulate holes. A dark current and a white spot of the first substrate 100 may be reduced by the first and second insulating layers. In an embodiment, a thickness of the second insulating layer (e.g., length in the third direction D3) may be greater than a thickness of the first insulating layer.

The third insulating layer may be disposed on the second insulating layer (e.g., disposed directly thereon in the third direction D3). In an embodiment, the third insulating layer may include a first silicon-containing material. For example, the first silicon-containing material may include tetraethyl orthosilicate (TEOS) or silicon oxide. The third insulating layer may have a good filling property. For example, the third insulating layer may be formed by a plasma-enhanced chemical vapor deposition (CVD) method. However, embodiments of the present inventive concept are not limited thereto and the third insulating layer may be formed by various other processes. A thickness of the third insulating layer (e.g., length in the third direction D3) may be greater than the thickness of the first insulating layer and may be greater than the thickness of the second insulating layer.

The fourth insulating layer may be disposed on the third insulating layer (e.g., disposed directly thereon in the third direction D3). In an embodiment, the fourth insulating layer may include a different material from that of the third insulating layer. For example, the fourth insulating layer may include a second silicon-containing material different from the first silicon-containing material. For example, the fourth insulating layer may include silicon nitride. A thickness of the fourth insulating layer (e.g., length in the third direction D3) may be greater than the thickness of the third insulating layer.

The fifth insulating layer may be disposed between the fourth insulating layer and the first fence pattern 310 (e.g., in the third direction D3) and between the fourth insulating layer and the color filters CF (e.g., in the third direction D3). The fifth insulating layer may be in direct physical contact with a bottom surface of the first fence pattern 310. In an embodiment, the fifth insulating layer may be an adhesive layer or a capping layer. For example, the fifth insulating layer may include a high-k dielectric material or a metal oxide. The fifth insulating layer may include the same material as the second insulating layer. For example, the fifth insulating layer may include hafnium oxide. A thickness (e.g., length in the third direction D3) of the fifth insulating layer may be greater than the thicknesses of the first and second insulating layers and may be less than the thicknesses of the third and fourth insulating layers.

However, embodiments of the present inventive concept are not limited thereto and the number of the layers of the insulating layer 400 may be variously changed. For example, in an embodiment, at least one of the first to fifth insulating layers may be omitted.

The protective layer 470 may cover the insulating layer 400 and the fence pattern 300. The protective layer 470 may include a high-k dielectric material and may have an insulating property. For example, the protective layer 470 may include aluminum oxide or hafnium oxide. However, embodiments of the present inventive concept are not limited thereto. The protective layer 470 may protect the photoelectric conversion regions PD of the first substrate 100 from an external environment such as moisture.

The color filters CF may be disposed on the protective layer 470 (e.g., disposed directly thereon in the third direction D3). The color filters CF may be spaced apart from each other by the fence pattern 300. The color filters CF may directly contact sidewalls of the fence pattern 300 and may not cover a top surface of the fence pattern 300.

In some embodiments, a top surface of each of the color filters CF may be convex upwards as illustrated in FIG. 3. For example, a level of a center of the top surface of the color filter CF may be higher than a level of a lateral edge of the top surface of the color filter CF. However, embodiments of the present inventive concept are not limited thereto and the cross-sectional shapes of the color filters CF may vary.

The micro lens layer 500 may be disposed on the first surface 100a of the first substrate 100. For example, the micro lens layer 500 may be disposed on the color filters CF and the fence pattern 300 (e.g., disposed directly thereon in the third direction D3). The protective layer 470 may be disposed between the second fence pattern 320 and the micro lens layer 500 (e.g., in the third direction D3).

The micro lens layer 500 may include a plurality of convex micro lenses 510. In an embodiment, the micro lenses 510 may be disposed at positions corresponding to the photoelectric conversion regions PD of the first substrate 100, respectively. For example, the micro lenses 510 may be disposed on the color filters CF, respectively, and may correspond to the color filters CF, respectively. The micro lenses 510 may be arranged in the first direction D1 and the second direction D2 to constitute an array when viewed in a plan view. Each of the micro lenses 510 may protrude in a direction away from the first surface 100a of the first substrate 100 (e.g., in the third direction D3). Each of the micro lenses 510 may have a hemispherical cross section. The micro lenses 510 may concentrate incident light.

In an embodiment, the micro lens layer 500 may be transparent to transmit light. The micro lens layer 500 may include an organic material such as a polymer. For example, the micro lens layer 500 may include a photoresist material or a thermosetting resin.

A lens coating layer 530 may be disposed on the micro lens layer 500 (e.g., disposed directly thereon in the third direction D3). The lens coating layer 530 may be transparent. The lens coating layer 530 may conformally cover a top surface of the micro lens layer 500. The lens coating layer 530 may protect the micro lens layer 500.

The first substrate 100 may include a ground region GND, a floating diffusion region FD and a dopant region Ill, which are adjacent to the second surface 100b (e.g., in the third direction D3). The ground region GND, the floating diffusion region FD and the dopant region 111 may be disposed in each of the pixel regions PX. A bottom surface of each of the ground region GND, the floating diffusion region FD and the dopant region 111 may be vertically spaced apart from the photoelectric conversion region PD (e.g., in the third direction D3).

In an embodiment, the ground region GND may be heavily doped with dopants to have the first conductivity type (e.g., a P+ type). Each of the floating diffusion region FD and the dopant region 11*l* may be doped with dopants to have the second conductivity type (e.g., an N-type).

The dopant region 111 may be a dopant region for operation of a transistor. The dopant region 111 may include source/drain regions of at least one of the conversion gain transistor Cx, the reset transistor Rx, the source follower transistor Sx and the selection transistor Ax, described above with reference to FIG. 1.

A device isolation pattern 240 may be disposed to be adjacent to the second surface 100b of the first substrate 100 (e.g., in the third direction D3). The device isolation pattern 240 may define an active region in the pixel region PX. For example, in the pixel region PX, the device isolation pattern 240 may define the ground region GND, the floating diffusion region FD, and the dopant region 111.

The device isolation pattern 240 may be disposed in a second trench 241, and the second trench 241 may be recessed from the second surface 100b of the first substrate 100 (e.g., in the third direction D3). In an embodiment, the device isolation pattern 240 may be a shallow trench isolation (ST1) pattern. A height of the device isolation pattern 240 (e.g., length in the third direction D3) may be less than a height of the isolation pattern 200 (e.g., length in the third direction D3). A portion of the device isolation pattern 240 may be connected to a sidewall of the isolation pattern 200. For example, in an embodiment, the device isolation pattern 240 may include at least one compound selected from silicon oxide, silicon nitride, or silicon oxynitride.

A buried gate pattern 700 may be disposed on the second surface 100b of the first substrate 100. The buried gate pattern 700 may include the transfer gate TG of the transfer transistor Tx described above in FIG. 1. In an embodiment, at least one additional gate pattern (e.g., see GEP of FIG. 5) may be disposed on each of the pixel regions PX.

The additional gate pattern may function as a gate electrode of at least one of the conversion gain transistor Cx, the source follower transistor Sx, the reset transistor Rx and the selection transistor Ax, described above with reference to FIG. 1. For example, the additional gate pattern may include the conversion gain gate CG, the source follower gate SG, the reset gate RG, or the selection gate AG.

The buried gate pattern 700 may have a buried gate structure. For example, the buried gate pattern 700 may include a first portion 710 and a second portion 720. The first portion 710 of the buried gate pattern 700 may be disposed on the second surface 100b of the first substrate 100. The second portion 720 of the buried gate pattern 700 may be buried in the first substrate 100. The second portion 720 of the buried gate pattern 700 may be connected to the first portion 710. However, embodiments of the present inventive concept are not limited thereto. For example, unlike the embodiment shown in FIG. 3, the buried gate pattern 700 may have a planar gate structure. In this embodiment, the buried gate pattern 700 may not include the second portion 720. In an embodiment, the buried gate pattern 700 may include a metal, a metal silicide, poly-silicon, or any combination thereof. For example, the poly-silicon may include doped poly-silicon.

A gate insulating pattern 740 may be disposed between the buried gate pattern 700 and the first substrate 100. For example, the gate insulating pattern 740 may cover the second portion 720 of the buried gate pattern 700. In an embodiment, the gate insulating pattern 740 may include a silicon-based insulating material (e.g., silicon oxide, silicon nitride, and/or silicon oxynitride) and/or a high-k dielectric material (e.g., hafnium oxide and/or aluminum oxide).

A first pad PAD1 may be disposed on the ground region GND. The first pad PAD1 may be disposed on the ground regions GND of the pixel regions PX adjacent to each other to electrically connect the ground regions GND to each other. The first pad PAD1 may include the first node N1 described with reference to FIG. 1.

A second pad PA D2 may be disposed on the floating diffusion region FD. The second pad PAD2 may be disposed on the floating diffusion regions FD of the pixel regions PX adjacent to each other to electrically connect the floating diffusion regions FD of the adjacent pixel regions PX to each other. The second pad PAD2 may include the second node N2 described with reference to FIG. 1.

In an embodiment, the first and second pads PAD1 and PAD2 may include a metal, a metal silicide, poly-silicon, or any combination thereof. For example, the first and second pads PAD1 and PAD2 may include doped poly-silicon. However, embodiments of the present inventive concept are not limited thereto.

The first interconnection layer 800 may be disposed on the second surface 100b of the first substrate 100. The first interconnection layer 800 may include a first interlayer insulating layer 810, second interlayer insulating layers 820, and a first conductive structure 830. The first interlayer insulating layer 810 may cover the second surface 100b of the first substrate 100 and the buried gate pattern 700. The second interlayer insulating layers 820 may be stacked on the first interlayer insulating layer 810 (e.g., stacked directly thereon in the third direction D3). For example, in an embodiment, each of the first and second interlayer insulating layers 810 and 820 may include a silicon-based insulating material such as silicon oxide, silicon nitride, and/or silicon oxynitride. However, embodiments of the present inventive concept are not limited thereto.

The first conductive structure 830 may be disposed in the first and second interlayer insulating layers 810 and 820. In an embodiment, the first conductive structure 830 may include contacts, interconnection lines, and vias. The contact may be disposed in the first and second interlayer insulating layers 810 and 820 adjacent to the second surface 100b so as to be connected to at least one of the buried gate pattern 700, the first and second pads PAD1 and PAD2, and the dopant region 111. The interconnection line of the first conductive structure 830 may be connected to the contact. The via of the first conductive structure 830 may penetrate at least one of the second interlayer insulating layers 820 and may connect the interconnection lines vertically adjacent to each other. The first conductive structure 830 may receive photoelectric signals outputted from the photoelectric conversion regions PD.

Hereinafter, a circuit chip 20 of the image sensor and the optical black region OBR and the pad region PDR of the first substrate 100 will be described in detail. Referring again to FIGS. 2 and 3, the optical black region OBR of the first substrate 100 may be disposed between the pixel array region APS and the pad region PDR (e.g., in the second direction D2). The optical black region OBR may include a first reference pixel region RPX1 and a second reference pixel region RPX2. The first reference pixel region RPX1 may be disposed between the second reference pixel region RPX2 and the pixel array region APS. In the optical black region OBR, the photoelectric conversion region PD may be disposed in the first reference pixel region RPX1. In an embodiment, the photoelectric conversion region PD of the first reference pixel region RPX1 may have the same planar area and volume as the photoelectric conversion regions PD of the pixel regions PX. The photoelectric conversion region PD may not be disposed in the second reference pixel region RPX2. The dopant region 111, the buried gate pattern 700 and the device isolation pattern 240 may be disposed in each of the first and second reference pixel regions RPX1 and RPX2.

The insulating layer 400 may extend from the pixel array region APS onto the pad region PDR via the optical black region OBR. A light blocking layer 950 may be disposed on the optical black region OBR. The light blocking layer 950 may be disposed on a top surface of the insulating layer 400 (e.g., disposed directly thereon in the third direction D3). Due to the light blocking layer 950, light may not be incident to the photoelectric conversion region PD of the optical black region OBR. Pixels of the first and second reference pixel regions RPX1 and RPX2 of the optical black region OBR may not output photoelectric signals but may output noise signals. The noise signal may be produced by electrons generated by occurrence of heat or a dark current. Since the light blocking layer 950 does not cover the pixel array region APS, light may be incident to the photoelectric conversion regions PD of the pixel array region APS. The noise signal may be removed from photoelectric signals outputted from the pixel regions PX. For example, in an embodiment, the light blocking layer 950 may include a metal such as tungsten, copper, aluminum, or any alloy thereof. However, embodiments of the present inventive concept are not limited thereto.

In the optical black region OBR of the first substrate 100, a first conductive pattern 911 may be disposed between the insulating layer 400 and the light blocking layer 950 (e.g., in the third direction D3). The first conductive pattern 911 may function as a barrier layer or an adhesive layer. The first conductive pattern 911 may include a metal and/or a metal nitride. For example, in an embodiment, the first conductive pattern 911 may include a metal such as copper, tungsten, aluminum, titanium, tantalum, or any alloy thereof. However, embodiments of the present inventive concept are not limited thereto. The first conductive pattern 911 may not extend onto the pixel array region APS of the first substrate 100.

In the optical black region OBR of the first substrate 100, a contact plug 960 may be disposed on the first surface 100a of the first substrate 100. The contact plug 960 may be disposed on (e.g., disposed directly thereon in the third direction D3) an upper surface of an outermost isolation pattern 200 in the optical black region OBR. A contact trench penetrating the insulating layer 400 may be defined on the first surface 100a of the first substrate 100, and the contact plug 960 may be disposed in the contact trench.

The contact plug 960 may include a different material from that of the light blocking layer 950. For example, in an embodiment, the contact plug 960 may include a metal material such as aluminum. The first conductive pattern 911 may extend between a sidewall of the contact plug 960 and the insulating layer 400 and between a lower surface of the contact plug 960 and the isolation pattern 200 (e.g., in the third direction D3).

A protective insulating layer 471 may be disposed on the optical black region OBR. The protective insulating layer 471 may be disposed on a top surface of the light blocking layer 950 and a top surface of the contact plug 960 (e.g., disposed directly thereon in the third direction D3). The protective insulating layer 471 may include the same material as the protective layer 470 and may be connected to the protective layer 470. The protective insulating layer 471 and the protective layer 470 may be formed in one body. However, embodiments of the present inventive concept are not limited thereto. For example, in some embodiments, the protective insulating layer 471 may be formed by a different process from a process of forming the protective layer 470 and may be spaced apart from the protective layer 470. The protective insulating layer 471 may include a high-k dielectric material (e.g., aluminum oxide and/or hafnium oxide).

A filtering layer 550 may be disposed on the first surface 100a of the optical black region OBR. The filtering layer 550 may cover a top surface of the protective insulating layer 471. The filtering layer 550 may block light having a different wavelength from those of the color filters CF. For example, the filtering layer 550 may block infrared light. The filtering layer 550 may include, but not limited to, a blue color filter.

An organic layer 501 may be disposed on a top surface and lateral side surfaces of the filtering layer 550. The organic layer 501 may be transparent. In an embodiment, a top surface of the organic layer 501 may be substantially flat. For example, the organic layer 501 may include a polymer. The organic layer 501 may have an insulating property. In some embodiments, the organic layer 501 may be connected to the micro lens layer 500. The organic layer 501 may include the same material as the micro lens layer 500.

A coating layer 531 may be disposed on the organic layer 501. The coating layer 531 may conformally cover a top surface of the organic layer 501. The coating layer 531 may include an insulating material and may be transparent. In an embodiment, the coating layer 531 may include the same material as the lens coating layer 530.

The image sensor may further include a circuit chip 20. The circuit chip 20 may be stacked on the sensor chip 10 (e.g., stacked directly thereon in the third direction DR3). The circuit chip 20 may include a second interconnection layer 1800 and a second substrate 1000. The second interconnection layer 1800 may be disposed between the first interconnection layer 800 and the second substrate 1000 (e.g., in the third direction D3). Integrated circuits 1700 may be disposed on a top surface of the second substrate 1000 and/or in the second substrate 1000. In an embodiment, the integrated circuits 1700 may include logic circuits, memory circuits, or a combination thereof. For example, the integrated circuits 1700 may include transistors. However, embodiments of the present inventive concept are not limited thereto.

The second interconnection layer 1800 may include third interlayer insulating layers 1820 and second conductive structures 1830. The second conductive structures 1830 may be disposed between the third interlayer insulating layers 1820 and/or in the third interlayer insulating layers 1820. The second conductive structures 1830 may be electrically connected to the integrated circuits 1700. The second interconnection layer 1800 may further include a via pattern, and the via pattern may be connected to the second conductive structures 1830 in the third interlayer insulating layers 1820.

The external connection pad 600 may be disposed on the pad region PDR of the first substrate 100. The external connection pad 600 may be adjacent to the first surface 100a of the first substrate 100. The external connection pad 600 may be buried in the first substrate 100. For example, a pad trench 990 may be defined in the first surface 100a of the first substrate 100 of the pad region PDR, and the external connection pad 600 may be disposed in the pad trench 990. In an embodiment, the external connection pad 600 may include a metal such as aluminum, copper, tungsten, titanium, tantalum, or any alloy thereof. However, embodiments of the present inventive concept are not limited thereto. In a mounting process of the image sensor, a bonding wire may be formed on the external connection pad 600 and may be connected to the external connection pad 600. The external connection pad 600 may be electrically connected to an external device through the bonding wire.

A first through-hole 901 may be defined to be adjacent to a first side of the external connection pad 600. The first through-hole 901 may be disposed between the external connection pad 600 and the contact plug 960 (e.g., in the second direction D2). The first through-hole 901 may penetrate the insulating layer 400, the first substrate 100, and the first interconnection layer 800. For example, the first through-hole 901 may fully penetrate the insulating layer 400, the first substrate 100, and the first interconnection layer 800 (e.g., in the third direction D3). The first through-hole 901 may further penetrate at least a portion of the second interconnection layer 1800. The first through-hole 901 may have a first bottom surface and a second bottom surface. In an embodiment, the first bottom surface of the first through-hole 901 may expose the first conductive structure 830. The second bottom surface of the first through-hole 901 may be disposed at a lower level than the first bottom surface. For example, in an embodiment, the second bottom surface of the first through-hole 901 may expose the second conductive structure 1830.

The first conductive pattern 911 may extend from the optical black region OBR onto the pad region PDR. The first conductive pattern 911 may cover an inner surface of the first through-hole 901. The first conductive pattern 911 in the first through-hole 901 may be in direct contact with a top surface of the first conductive structure 830. Thus, the first conductive structure 830 may be electrically connected to a second isolation pattern (220 of FIG. 6A) of the isolation pattern 200 through the first conductive pattern 911.

The first conductive pattern 911 in the first through-hole 901 may also be connected to a top surface of the second conductive structure 1830. The second conductive structure 1830 may be electrically connected to the first conductive structure 830 and the second isolation pattern 220 through the first conductive pattern 911.

A first filling pattern 921 may be disposed in the first through-hole 901 to fill the first through-hole 901. In an embodiment, the first filling pattern 921 may include a low-refractive index material and may have an insulating property. In an embodiment, the first filling pattern 921 may include the same material as the second fence pattern 320. A top surface of the first filling pattern 921 may have a recess. For example, a center of the top surface of the first filling pattern 921 may be lower than a lateral edge of the top surface of the first filling pattern 921.

A first capping pattern 931 may be disposed on the top surface of the first filling pattern 921 to fill the recess. In an embodiment, a top surface of the first capping pattern 931 may be substantially flat. The first capping pattern 931 may include an insulating polymer such as a photoresist material.

A second through-hole 902 may be defined to be adjacent to a second side of the external connection pad 600. The second through-hole 902 may penetrate the insulating layer 400, the first substrate 100, and the first interconnection layer 800. For example, the second through-hole 902 may fully penetrate the insulating layer 400, the first substrate 100, and the first interconnection layer 800 (e.g., in the third direction D3). In an embodiment, the second through-hole 902 may penetrate a portion of the second interconnection layer 1800 to expose the second conductive structure 1830.

A second conductive pattern 912 may be disposed on the pad region PDR. The second conductive pattern 912 may be disposed in the second through-hole 902 to conformally cover an inner sidewall and a bottom surface of the second through-hole 902. The second conductive pattern 912 may be electrically connected to the second conductive structure 1830.

The second conductive pattern 912 may extend between the external connection pad 600 and an inner surface of the pad trench 990 to cover a bottom surface and a sidewall of the external connection pad 600. When the image sensor operates, the integrated circuits 1700 of the circuit chip 20 may transmit/receive electrical signals through the second conductive structure 1830, the second conductive pattern 912 and the external connection pad 600.

A second filling pattern 922 may be disposed in the second through-hole 902 to fill the second through-hole 902. In an embodiment, the second filling pattern 922 may include a low-refractive index material and may have an insulating property. For example, the second filling pattern 922 may include the same material as the second fence pattern 320. A top surface of the second filling pattern 922 may have a recess.

A second capping pattern 932 may be disposed on the top surface of the second filling pattern 922 to fill the recess. A top surface of the second capping pattern 932 may be substantially flat. The second capping pattern 932 may include an insulating polymer such as a photoresist material.

The protective insulating layer 471 may extend from the optical black region OBR onto the pad region PDR. The protective insulating layer 471 may be disposed on the top surface of the insulating layer 400 and may extend into the first through-hole 901 and the second through-hole 902. The protective insulating layer 471 may be disposed between the first conductive pattern 911 and the first filling pattern 921 in the first through-hole 901. The protective insulating layer 471 may be disposed between the second conductive pattern 912 and the second filling pattern 922 in the second through-hole 902. The protective insulating layer 471 may expose the external connection pad 600.

Figure 4:
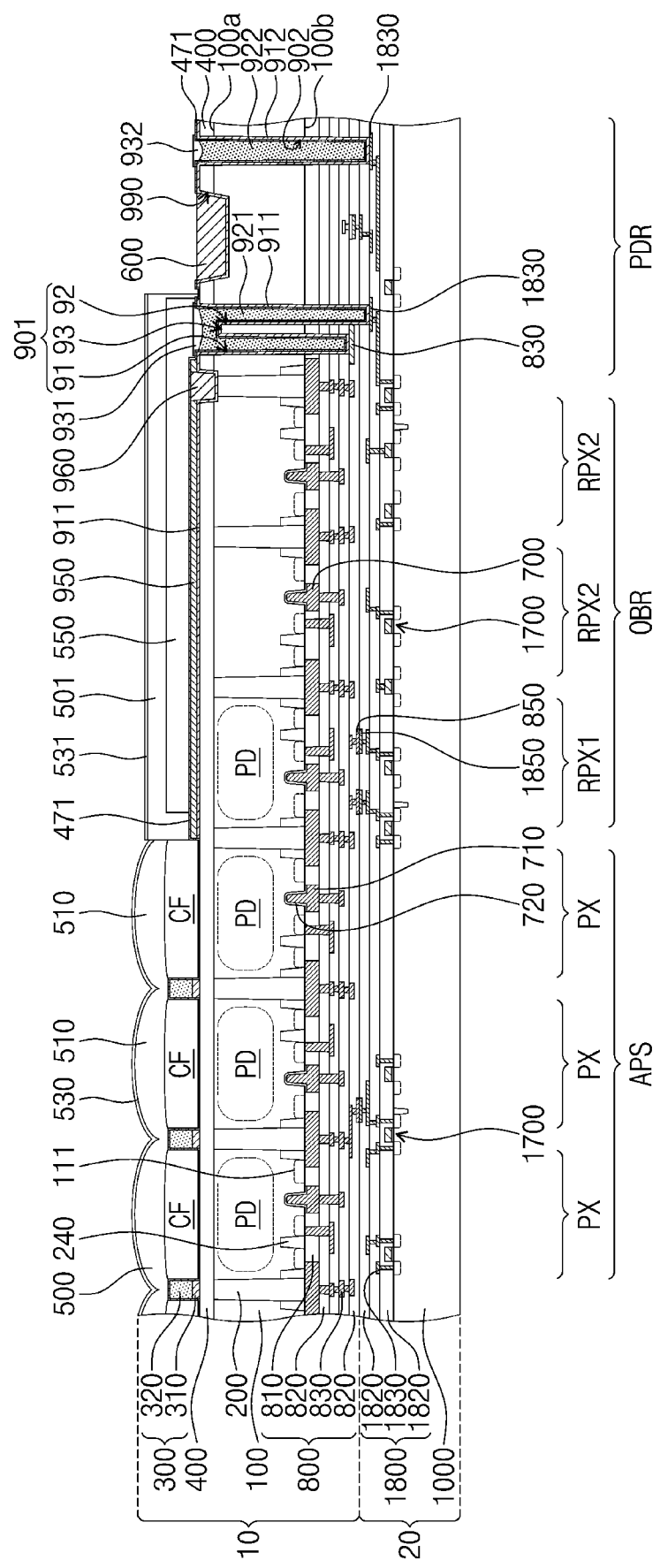
FIG. 4 is a cross-sectional view taken along the line I-I' of FIG. 2 illustrating an image sensor according to an embodiment of the present inventive concept.

FIG. 4 is a cross-sectional view taken along the line I-I' of FIG. 2 to illustrate an image sensor according to some embodiments of the present inventive concept. In the present embodiments, the descriptions of the same or similar technical features as in the embodiments of FIGS. 1 to 3 will be omitted for the purposes of ease and convenience in explanation and differences between the present embodiments and the embodiments of FIGS. 1 to 3 will be mainly described hereinafter.

Referring to FIGS. 2 and 4, an image sensor may include a sensor chip 10 and a circuit chip 20. The sensor chip 10 may include a first connection pad 850. The first connection pad 850 may be exposed at a bottom surface of the sensor chip 10. The first connection pad 850 may be disposed in a lowermost second interlayer insulating layer 820. The first connection pad 850 may be electrically connected to the first conductive structure 830. In an embodiment, the first connection pad 850 may include a conductive material such as a metal. For example, the first connection pad 850 may include copper. However, embodiments of the present inventive concept are not limited thereto. For example, in some embodiments, the first connection pad 850 may include aluminum, tungsten, titanium, and/or any alloy thereof.

The circuit chip 20 may include a second connection pad 1850. The second connection pad 1850 may be exposed at a top surface of the circuit chip 20. The second connection pad 1850 may be disposed in an uppermost third interlayer insulating layer 1820. The second connection pad 1850 may be electrically connected to the integrated circuits 1700. In an embodiment, the second connection pad 1850 may include a conductive material such as a metal. For example, the second connection pad 1850 may include copper. However, embodiments of the present inventive concept are not limited thereto. For example, in some embodiments, the second connection pad 1850 may include aluminum, tungsten, titanium, and/or any alloy thereof.

In an embodiment, the circuit chip 20 may be connected to the sensor chip 10 by direct bonding. For example, the first connection pad 850 and the second connection pad 1850 may be vertically aligned with each other (e.g., may overlap each other in the third direction D3), and the first connection pad 850 and the second connection pad 1850 may be in direct contact with each other. Thus, the second connection pad 1850 may be bonded directly to the first connection pad 850. As a result, the integrated circuits 1700 of the circuit chip 20 may be electrically connected to the transistors and/or the external connection pad 600 of the sensor chip 10 through the first and second connection pads 850 and 1850.

In an embodiment, the second interlayer insulating layer 820 may be adhered directly to the third interlayer insulating layer 1820. In this embodiment, chemical bonds may be formed between the second interlayer insulating layer 820 and the third interlayer insulating layer 1820.

A first through-hole 901 may include a first through-hole portion 91, a second through-hole portion 92, and a third through-hole portion 93. The first through-hole portion 91 may penetrate the insulating layer 400, the first substrate 100, and the first interconnection layer 800 and may have a first bottom surface. For example, the first through-hole portion 91 may fully penetrate the insulating layer 400 and the first substrate 100 (e.g., in the third direction D3) and may penetrate a portion of the first interconnection layer 800. The second through-hole portion 92 may penetrate (e.g., fully penetrate in the third direction D3) the insulating layer 400, the first substrate 100, and the first interconnection layer 800 and may extend into an upper portion of the second interconnection layer 1800. The second through-hole portion 92 may have a second bottom surface exposing a top surface of the second conductive structure 1830. A sidewall of the second through-hole portion 92 may be spaced apart from a sidewall of the first through-hole portion 91. The third through-hole portion 93 may be disposed between an upper portion of the first through-hole portion 91 and an upper portion of the second through-hole portion 92 and may be connected to the upper portion of the first through-hole portion 91 and the upper portion of the second through-hole portion 92. The first conductive pattern 911, the protective insulating layer 471 and the first filling pattern 921 may be disposed in the first through-hole 901. The first conductive pattern 911 may cover inner surfaces of the first through-hole portion 91, the second through-hole portion 92 and the third through-hole portion 93.

Figure 5:
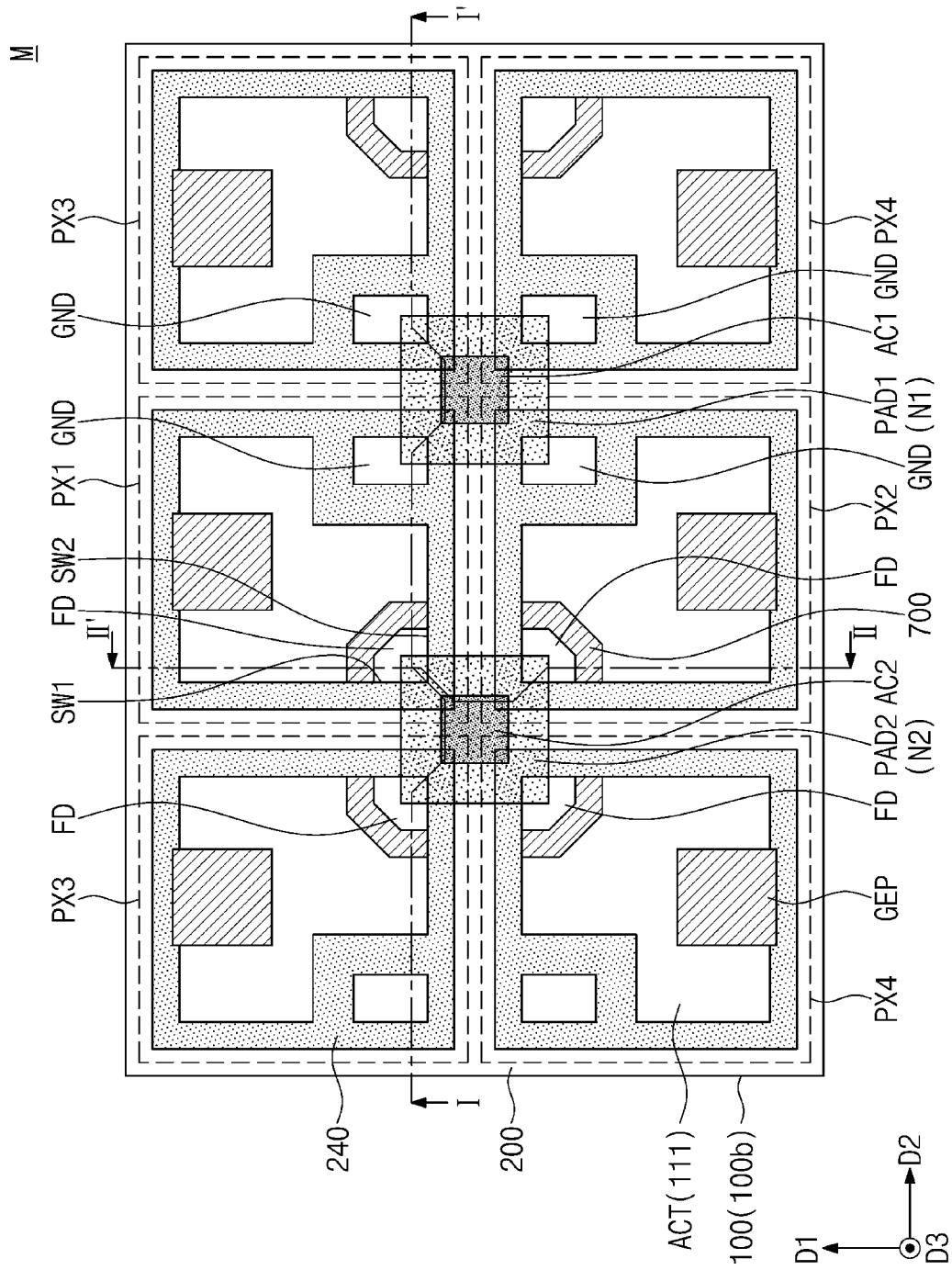
FIG. 5 is an enlarged plan view of a region 'M' of FIG. 2 illustrating pixels of an image sensor according to an embodiment of the present inventive concept.
Figure 6A:
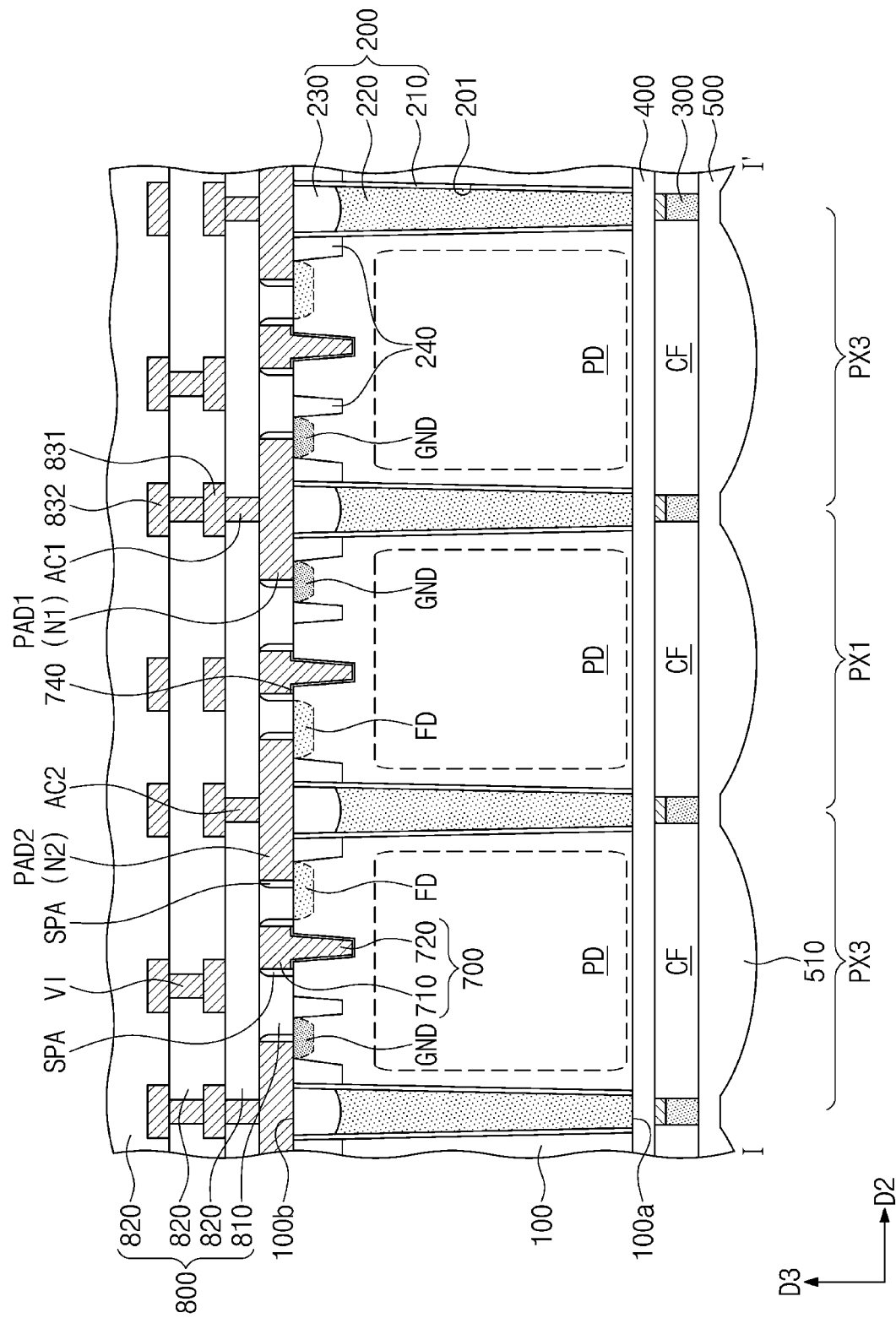
FIG. 6A is a cross-sectional view taken along line I-I' of FIG. 5 according to an embodiment of the present inventive concept.
Figure 6B:
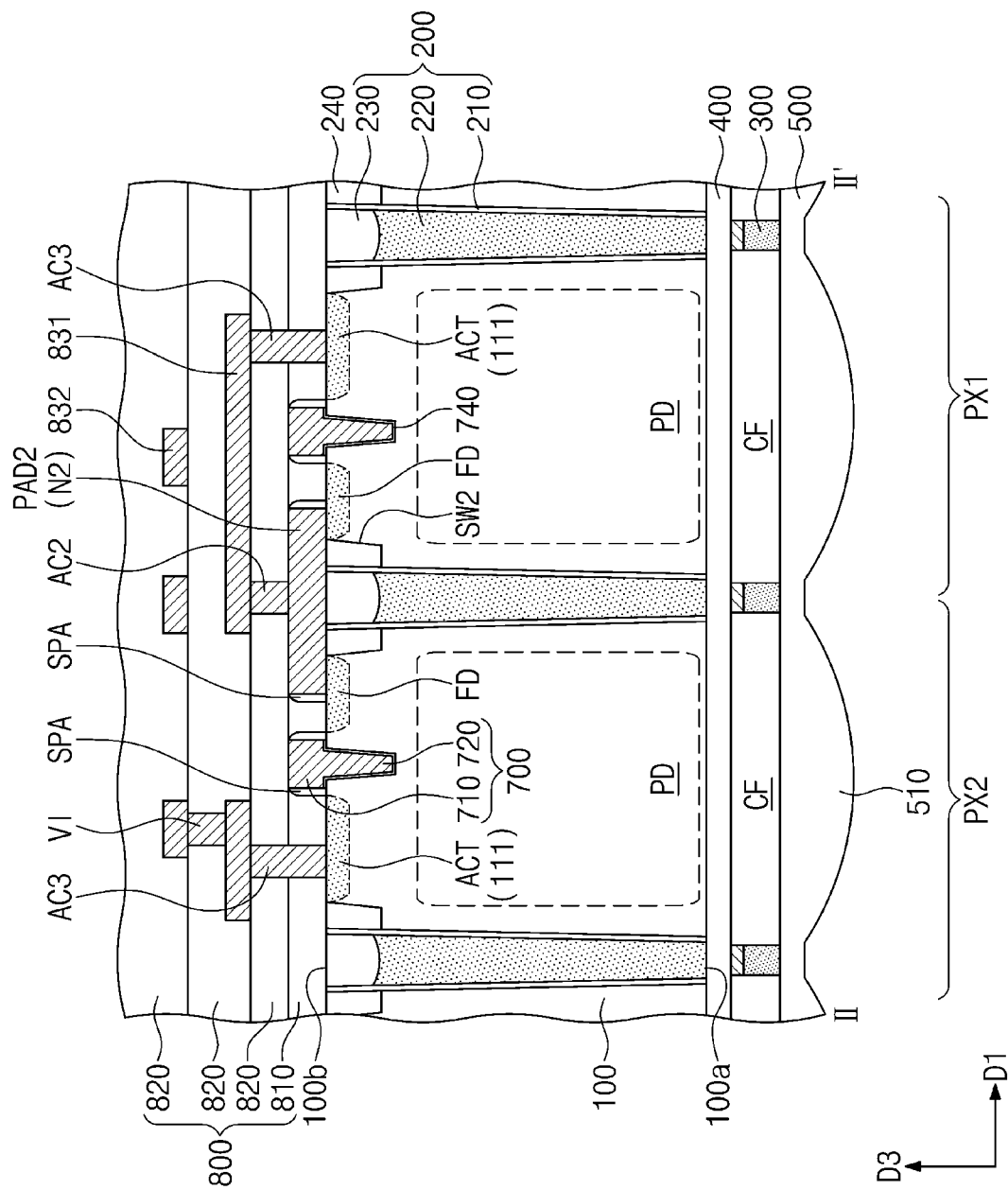
FIG. 6B is a cross-sectional view taken along line II-II' of FIG. 5 according to an embodiment of the present inventive concept.

FIG. 5 is an enlarged plan view of a region 'M' of FIG. 2 to illustrate pixels of an image sensor according to some embodiments of the present inventive concept. FIG. 6A is a cross-sectional view taken along a line I-I' of FIG. 5. FIG. 6B is a cross-sectional view taken along a line II-II' of FIG. 5. In the present embodiments, the descriptions of the same or similar technical features as in the embodiments of FIGS. 1 to 3 will be omitted for the purposes of ease and convenience in explanation and differences between the present embodiments and the embodiments of FIGS. 1 to 3 will be mainly described hereinafter.

Referring to FIGS. 5, 6A and 6B, the image sensor according to some embodiments of the present inventive concept may include a plurality of pixel regions PX1 to PX4. For example, first and second pixel regions PX1 and PX2 may be disposed adjacent to each other in the first direction D1. Third and fourth pixel regions PX3 and PX4 may be disposed adjacent to each other in the first direction D1. The third pixel regions PX3 may be disposed at both lateral sides of the first pixel region PX1, respectively. For example, the first pixel region PX1 may be disposed between the third pixel regions PX3 (e.g., in the second direction D2). The fourth pixel regions PX4 may be disposed at both lateral sides of the second pixel region PX2, respectively. For example, the second pixel region PX2 may be disposed between the fourth pixel regions PX4 (e.g., in the second direction D2).

The first substrate 100 may include the first surface 100a (e.g., the back surface) and the second surface 100b (e.g., the front surface). The isolation pattern 200 penetrating the first substrate 100 may define the first to fourth pixel regions PX1 to PX4. In an embodiment, the isolation pattern 200 may include a first isolation pattern 210, a second isolation pattern 220, and an insulating pattern 230.

The first isolation pattern 210 may be disposed on a sidewall of the first trench 201. For example, the first isolation pattern 210 may include a silicon-based insulating material (e.g., silicon nitride, silicon oxide, and/or silicon oxynitride) and/or a high-k dielectric material (e.g., hafnium oxide and/or aluminum oxide). In some embodiments, the first isolation pattern 210 may include a plurality of layers, and the layers may include different materials. The first isolation pattern 210 may have a refractive index lower than that of the first substrate 100. Therefore, it is possible to reduce or prevent a crosstalk phenomenon between the first to fourth pixel regions PX1 to PX4 of the first substrate 100.

The second isolation pattern 220 may be disposed in the first isolation pattern 210. The first isolation pattern 210 may be disposed between the second isolation pattern 220 and the first substrate 100. The second isolation pattern 220 may be spaced apart from the first substrate 100 by the first isolation pattern 210. Thus, when the image sensor operates, the second isolation pattern 220 may be electrically isolated from the first substrate 100. In an embodiment, the second isolation pattern 220 may include a conductive material such as doped poly-silicon. The second isolation pattern 220 may include dopants having the first conductivity type or dopants having the second conductivity type.

The insulating pattern 230 may be disposed on the second isolation pattern 220. For example, a lower surface of the insulating pattern 230 may directly contact an upper surface of the second isolation pattern 220 (e.g., in the third direction D3). A top surface of the insulating pattern 230 may be substantially coplanar with the second surface 100b of the first substrate 100 (e.g., in the third direction D3). In an embodiment, the insulating pattern 230 may include a silicon-based insulating material such as silicon oxide. However, embodiments of the present inventive concept are not limited thereto.

The contact plug 960 described in FIG. 3 may be electrically connected to the second isolation pattern 220 through the first conductive pattern 911. A negative bias voltage may be applied to the second isolation pattern 220 through the contact plug 960. Positive charges generated in the first to fourth pixel regions PX1 to PX4 may be removed through the second isolation pattern 220 surrounding each of the first to fourth pixel regions PX1 to PX4. As a result, a dark current of the image sensor may be reduced.

The photoelectric conversion region PD may be disposed in each of the pixel regions PX1 to PX4. The photoelectric conversion region PD may include a first region adjacent to the first surface 100a (e.g., in the third direction D3) and a second region adjacent to the second surface 100b (e.g., in the third direction D3). A dopant concentration of the first region of the photoelectric conversion region PD may be different from a dopant concentration of the second region of the photoelectric conversion region PD. Thus, the photoelectric conversion region PD may have a potential gradient between the first surface 100a and the second surface 100b of the first substrate 100.

The first substrate 100 and the photoelectric conversion region PD may constitute a photodiode. For example, the photodiode may be formed by a PN junction of the first substrate 100 having the first conductivity type (e.g., the P-type) and the photoelectric conversion region PD having the second conductivity type (e.g., the N-type). The photoelectric conversion region PD forming the photodiode may generate and accumulate photocharges in proportion to the intensity of incident light.

The device isolation pattern 240 may be disposed on the second surface 100b of the first substrate 100. The device isolation pattern 240 may define the ground region GND, the floating diffusion region FD and an active region ACT in each of the first to fourth pixel regions PX1 to PX4. The active region ACT may include the dopant region 111. In the present embodiment, the ground region GND may be spaced apart from the floating diffusion region FD and the active region ACT by the device isolation pattern 240 (see FIG. 5). For example, the ground region GND may have an island shape surrounded by the device isolation pattern 240.

The isolation pattern 200 and the device isolation pattern 240 may constitute an isolation structure. The first to fourth pixel regions PX1 to PX4, the ground regions GND, the floating diffusion regions FD and the active regions ACT may be defined by the isolation structure.

At least one gate pattern GEP may be disposed on the active region ACT. The active region ACT and the gate pattern GEP may constitute at least one of the conversion gain transistor Cx, the reset transistor Rx, the source follower transistor Sx and the selection transistor Ax, described with reference to FIG. 1.

The buried gate pattern 700 may be disposed between the active region ACT and the floating diffusion region FD (e.g., in the first direction D1). Spacers SPA may be disposed on both sidewalls of the buried gate pattern 700. In an embodiment, the spacers SPA may include a silicon-based insulating material, such as silicon oxide, silicon nitride, and/or silicon oxynitride. However, embodiments of the present inventive concept are not limited thereto.

The first pixel region PX1 will be described in detail as a representative of the first to fourth pixel regions PX1 to PX4. The floating diffusion region FD of the first pixel region PX1 may be defined by a first sidewall SW1 and a second sidewall SW2 of the device isolation pattern 240. In an embodiment, the first sidewall SW1 may extend in the first direction D1, and the second sidewall SW2 may extend in the second direction D2.

As illustrated in FIG. 5, the buried gate pattern 700 of the first pixel region PX1 may extend from the first sidewall SW1 to the second sidewall SW2 of the device isolation pattern 240 when viewed in a plan view. Thus, the floating diffusion region FD of the first pixel region PX1 may have an island shape surrounded by the first and second sidewalls SW1 and SW2 of the device isolation pattern 240 and the buried gate pattern 700.

According to some embodiments of the present inventive concept, an area of the floating diffusion region FD may be reduced due to the second pad PAD2 connecting the floating diffusion regions FD in common. For example, the area of the floating diffusion region FD may be reduced due to a reduction of problems concerning misalignment of a contact. According to an embodiment of the present inventive concept, since the area of the floating diffusion region FD is reduced, the floating diffusion region FD may be realized in the island shape surrounded by the device isolation pattern 240 and the buried gate pattern 700.

The first pad PAD1 may be disposed on the ground regions GND of the first to fourth pixel regions PX1 to PX4 adjacent to each other. The first pad PAD1 may have a quadrilateral shape (e.g., a square shape) when viewed in a plan view (e.g., in a plane defined in the first and second directions D1, D2). In an embodiment, corners of the first pad PAD1 may be in direct contact with the ground regions GND of the first to fourth pixel regions PX1 to PX4, respectively. The first pad PAD) may intersect the device isolation pattern 240 and the isolation pattern 200 and may connect adjacent ground regions GND to each other. For example, the first pad PAD1 may include the first node N1 (see FIG. 1) for applying the ground voltage VSS to the ground regions GND of the first to fourth pixel regions PX1 to PX4 in common.

The second pad PAD2 may be disposed on the floating diffusion regions FD of the first to fourth pixel regions PX1 to PX4 adjacent to each other. The second pad PAD2 may have a quadrilateral shape (e.g., a square shape) when viewed in a plan view. In an embodiment, corners of the second pad PAD2 may be in direct contact with the floating diffusion regions FD of the first to fourth pixel regions PX1 to PX4, respectively. The second pad PAD2 may intersect the device isolation pattern 240 and the isolation pattern 200 and may connect adjacent floating diffusion regions FD to each other. For example, the second pad PAD2 may be connected in common to the floating diffusion regions FD of the first to fourth pixel regions PX1 to PX4.

A first surface (e.g., a bottom surface) of the second pad PAD2 may be disposed on portions of the first to fourth pixel regions PX1 to PX4. The first surface of the second pad PAD2 may also be disposed on a portion of the isolation pattern 200 and a portion of the device isolation pattern 240.

The spacers SPA may also be disposed on sidewalls of the first and second pads PAD1 and PAD2. In the present embodiments, the first and second pads PAD1 and PAD2 may be formed simultaneously with the buried gate pattern 700 and the gate pattern GEP. Thus, in an embodiment, the first and second pads PAD1 and PAD2 may include the same conductive material (e.g., doped poly-silicon) as the buried gate pattern 700 and the gate pattern GEP.

The first interconnection layer 800 may be disposed on the second surface 100b of the first substrate 100. The first interconnection layer 800 may include a plurality of metal layers sequentially stacked (e.g., in the third direction D3). For example, a first metal layer may include first interconnection lines 831, and a second metal layer on the first metal layer may include second interconnection lines 832.

A first contact AC1 may be disposed between the first pad PAD1 and one of the first interconnection lines 831. The one of the first interconnection lines 831 may be used to apply the ground voltage VSS to the ground regions GND of the first to fourth pixel regions PX1 to PX4 in common through the first contact AC1 and the first pad PAD1.

A second contact AC2 may be disposed between the second pad PAD2 and another of the first interconnection lines 831. The other of the first interconnection lines 831 may be connected in common to the floating diffusion regions FD of the first to fourth pixel regions PX1 to PX4 through the second contact AC2 and the second pad PAD2.

Referring to FIG. 6B, the first interconnection line 831 connected to the second pad PAD2 may be connected to the active region ACT of the first pixel region PX1 through a third contact AC3. For example, the active region ACT of the first pixel region PX1 may be connected in common to the floating diffusion regions FD of the first to fourth pixel regions PX1 to PX4. The active region ACT of the first pixel region PX1 and the gate pattern GEP thereon may constitute the conversion gain transistor Cx.

Figure 17:
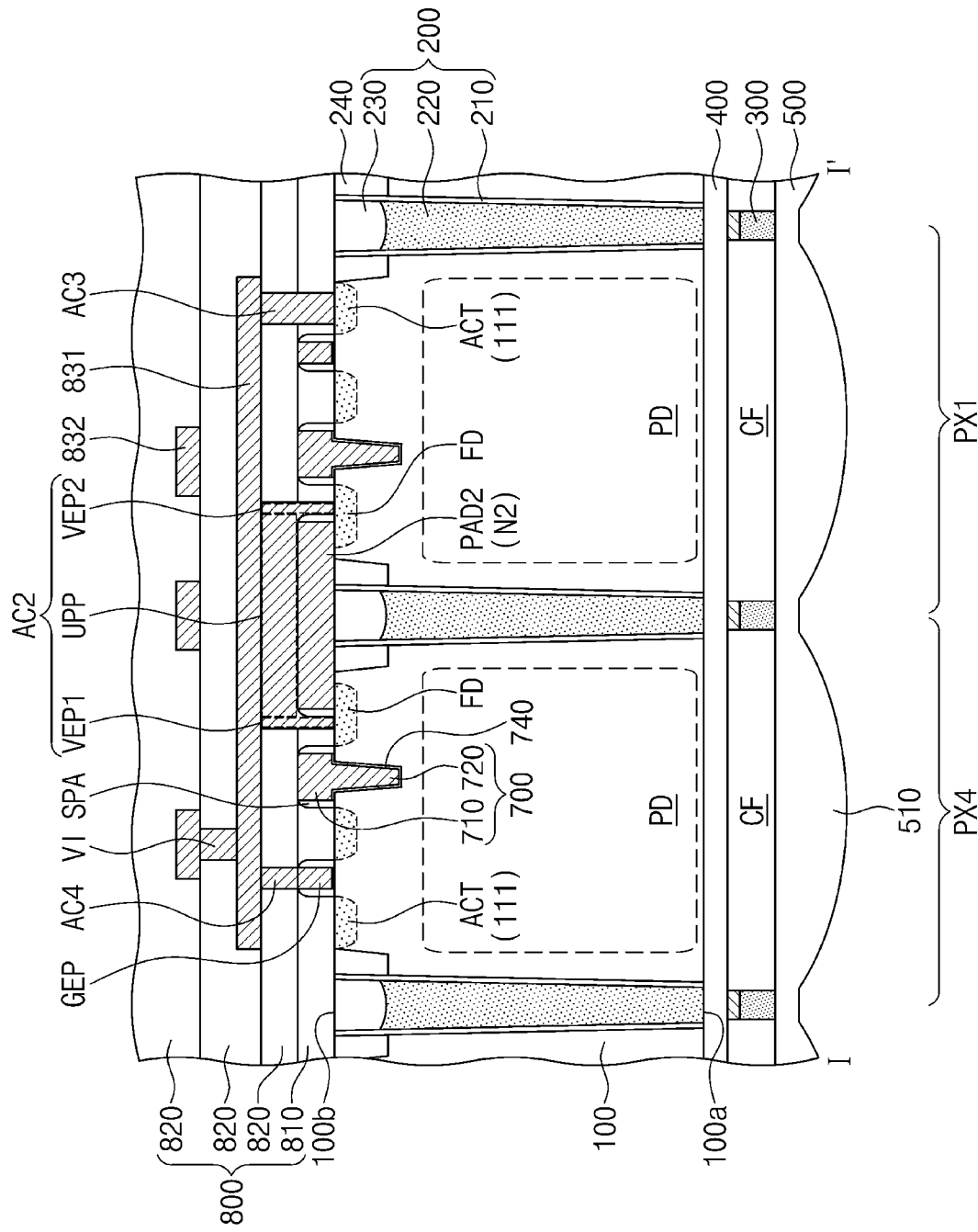
FIG. 17 is a cross-sectional view taken along line I-I' of FIG. 16 according to an embodiment of the present inventive concept.

Referring to FIG. 17 to be described later in more detail, the first interconnection line 831 connected to the second pad PAD2 may be connected to the gate pattern GEP of the fourth pixel region PX4 through a fourth contact AC4. For example, the gate pattern GEP of the fourth pixel region PX4 may be connected in common to the floating diffusion regions FD of the first to fourth pixel regions PX1 to PX4. The active region ACT of the fourth pixel region PX4 and the gate pattern GEP thereon may constitute the source follower transistor Sx.

FIG. 6B illustrates the structure in which the second contact AC2 and the third contact AC3 are connected to each other through the first interconnection line 831. However, embodiments of the present inventive concept are not limited thereto. For example, in an embodiment, the second contact AC2 and the third contact AC3 may be connected to each other through the first interconnection line 831 and the second interconnection line 832 thereon.

A via VI may be provided between the second interconnection line 832 and the first interconnection line 831 (e.g., in the third direction D3). The first metal layer and the second metal layer may be connected to each other through the via VI.

The insulating layer 400 may be disposed on the first surface 100a of the first substrate 100 (e.g., disposed directly thereon in the third direction D3). The fence pattern 300 may be disposed on the insulating layer 400. The color filters CF may be disposed between portions of the fence pattern 300 having the grid shape. The micro lens layer 500 including the micro lenses 510 may be disposed on the color filters CF. The micro lenses 510 may cover the first to fourth pixel regions PX1 to PX4, respectively (see FIG. 19). However, embodiments of the present inventive concept are not limited thereto and the arrangement of the micro lenses 510 may vary. For example, in some embodiments, a single micro lens 510 may cover the first to fourth pixel regions PX1 to PX4 (see FIG. 20).

According to an embodiment of the present inventive concept, the first pad PAD1 may be connected in common to the ground regions GND of the pixel regions PX1 to PX4 adjacent to each other. One first contact AC1 and one first interconnection line 831 may be connected in common to the ground regions GND of the first to fourth pixel regions PX1 to PX4. Thus, the number of the interconnection lines required in the first interconnection layer 800 may be reduced. Since the number of the interconnection lines is reduced, a degree of freedom of routing of the interconnection lines may be increased, and the routing may be efficiently performed. A leakage current through a contact may be inhibited or prevented by reduction in the number of the contacts.

Since a contact is not connected to each of the ground regions GND but the first pad PAD1 is connected in common to the ground regions GND, it is not necessary to consider misalignment of a contact. Thus, an area of the ground region GND may be reduced. As a result, a size of die pixel of the image sensor may be reduced to increase an integration density. Alternatively, an area of the active region ACT in the pixel may be increased by the amount of the reduction in the area of the ground region GND, and thus more transistors may be integrated on the active region ACT.

According to an embodiment of the present inventive concept, the second pad PAD2 may be connected in common to the floating diffusion regions FD of the first to fourth pixel regions PX1 to PX4 adjacent to each other. Thus, as described above for the first pad PAD1, the degree of freedom of the routing may be increased, the leakage current may be prevented, and the integration density may be increased.

If a contact and an interconnection line are connected to each of the floating diffusion regions FD, a capacitance of the floating diffusion region FD may be increased performance of the image sensor may decrease. However, according to the embodiments of the present inventive concept, a plurality of the floating diffusion regions FD may be connected to one contact and one interconnection line, and thus the capacitance of the floating diffusion region FD may be reduced to increase the performance of the image sensor.

FIGS. 7 to 15 are cross-sectional views illustrating a method of manufacturing an image sensor according to some embodiments of the present inventive concept. FIGS. 7 to 15 are cross-sectional views taken along the line I-I' of FIG. 5.

Referring to FIGS. 5 and 7, a first substrate 100 may be provided. The first substrate 100 may have a first surface 100a and a second surface 100b which are opposite to each other (e.g., in the third direction D3). The first substrate 100 may have a first conductivity type (e.g., a P-type) or may be doped with dopants to have the first conductivity type.

A device isolation pattern 240 may be formed at the second surface 100b of the first substrate 100. For example, in an embodiment, a second trench 241 may be formed by patterning the second surface 100b of the first substrate 100. An insulating layer filling the second trench 241 may be formed. The insulating layer may be planarized until the second surface 100b of the first substrate 100 is exposed, thereby forming the device isolation pattern 240. For example, in an embodiment, the insulating layer may include at least one of a silicon oxide layer, a silicon nitride layer, or a silicon oxynitride layer. However, embodiments of the present inventive concept are not limited thereto.

Figure 8:
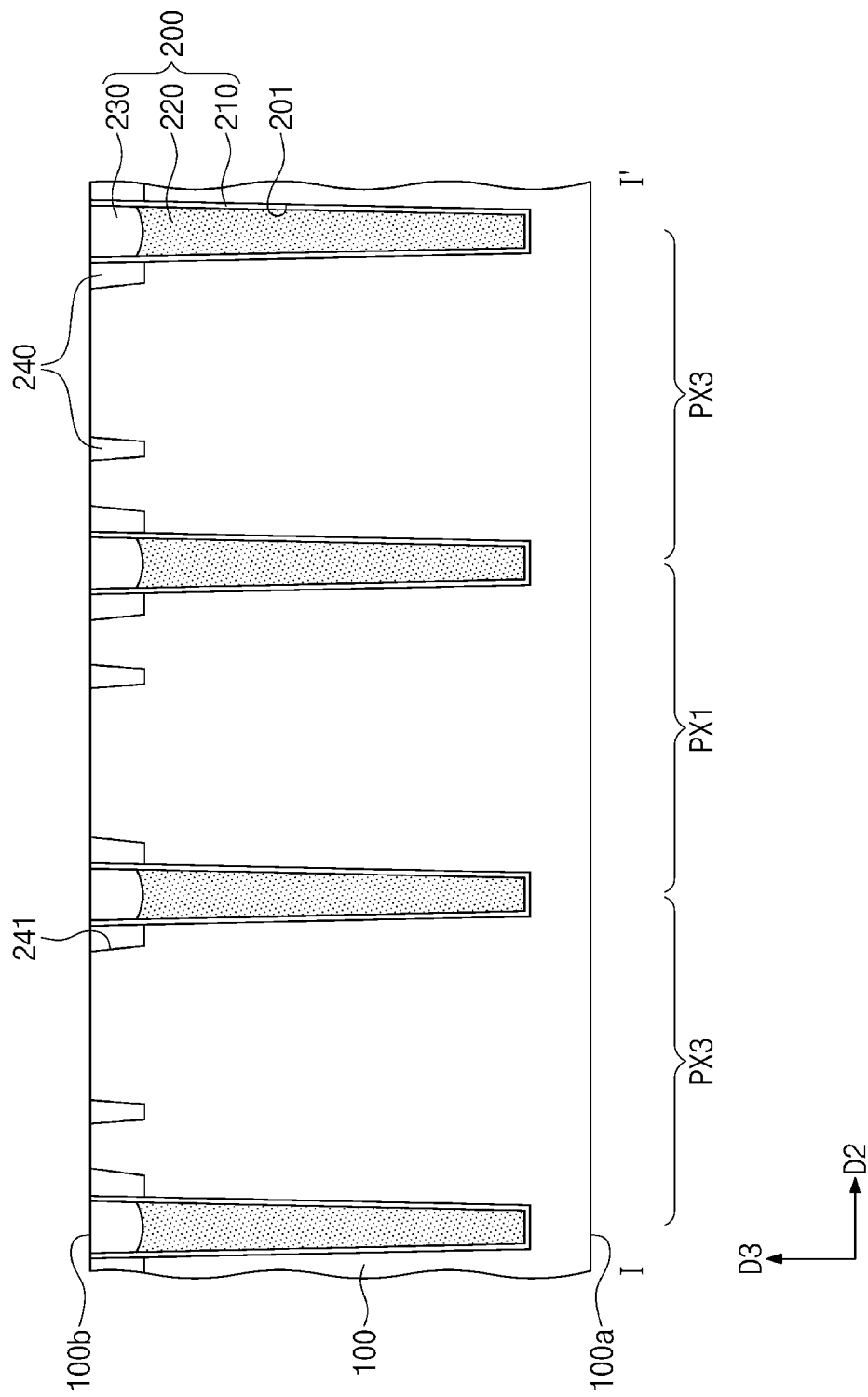

Referring to FIGS. 5 and 8, an isolation pattern 200 may be formed in the second surface 100b of the first substrate 100. For example, the second surface 100b of the first substrate 100 may be patterned to form a first trench 201 defining a plurality of pixel regions, such as the first to fourth pixel regions PX1 to PX4. The first trench 201 may have a grid shape when viewed in a plan view.

A portion of the device isolation pattern 240 may be etched in the formation of the first trench 201. The first trench 201 may be formed to penetrate a portion of the device isolation pattern 240.

The first trench 201 may extend from the second surface 100b towards the first surface 100a (e.g., in the third direction D3). For example, a width of the first trench 201 (e.g., length in the second direction D2) may become progressively smaller from the second surface 100b toward the first surface 100a. The first trench 201 may be deeper than the second trench 241 filled with the device isolation pattern 240. For example, a bottom surface of the first trench 201 may be positioned closer to the first surface 100a than a bottom surface of the second trench 241. A bottom surface of the first trench 201 may be vertically spaced apart from the first surface 100a (e.g., in the third direction D3).

A first isolation pattern 210 partially filling the first trench 201 may be formed. The formation of the first isolation pattern 210 may include conformally forming an insulating layer on the second surface 100b of the first substrate 100. The first isolation pattern 210 may cover an inner sidewall and the bottom surface of the first trench 201. For example, in an embodiment, the insulating layer may include a silicon-based insulating material and/or a high-k dielectric material.

A second isolation pattern 220 may be formed on the first isolation pattern 210. The formation of the second isolation pattern 220 may include forming a conductive layer filling the first trench 201, and etching the conductive layer by an etch-back process. The second isolation pattern 220 may fill a lower portion of the first trench 201. For example, the second isolation pattern 220 may fill a remaining portion except an upper portion of the first trench 201. A top surface of the second isolation pattern 220 may be lower than the second surface 100b of the first substrate 100. For example, in an embodiment, the conductive layer may include doped poly-silicon. However, embodiments of the present inventive concept are not limited thereto.

An insulating pattern 230 may be formed on the second isolation pattern 220. The formation of the insulating pattern 230 may include forming an insulating layer filling the upper portion of the first trench 201. For example, in an embodiment, the insulating layer may include a silicon-based insulating material. Thereafter, a planarization process may be performed on the insulating layer until the second surface 100b of the first substrate 100 is exposed, thereby forming the isolation pattern 200.

Figure 9:
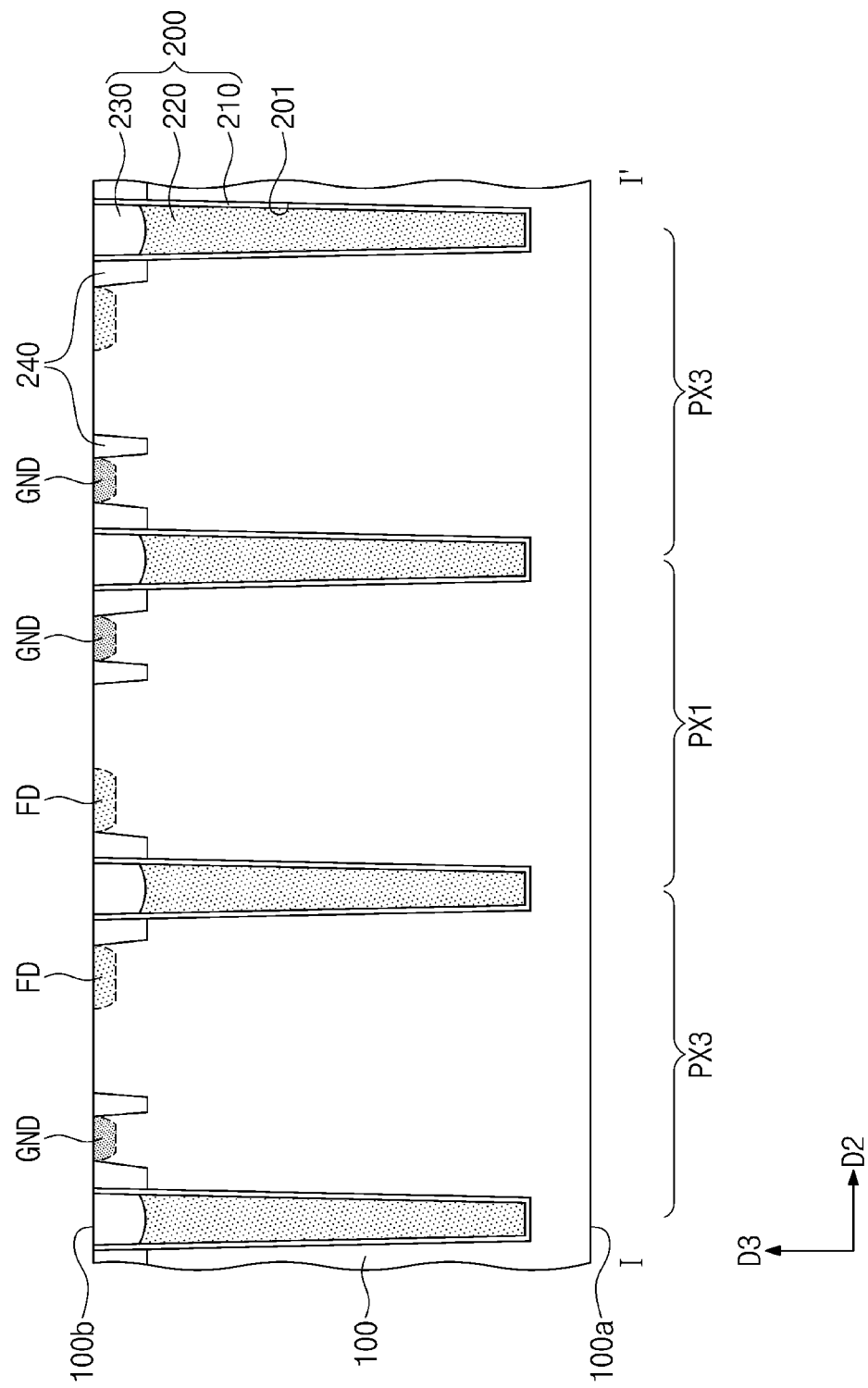

Referring to FIGS. 5 and 9, a ground region GND, a floating diffusion region FD and an active region ACT may be formed in each of the first to fourth pixel regions PX1 to PX4. For example, in an embodiment, dopant implantation processes may be performed on the second surface 100b of the first substrate 100 to form dopant regions. The dopant regions may include the ground region GND, the floating diffusion region FD, and the active region ACT. In an embodiment, the ground region GND may be doped with dopants to have the first conductivity type (e.g., a P+ type), and each of the floating diffusion region FD and the active region ACT may be doped with dopants to have a second conductivity type (e.g., an N-type).

However, embodiments of the present inventive concept are not limited thereto. For example, in some embodiments, the ground region GND, the floating diffusion region FD and the active region ACT may be formed after formation of buried gate patterns 700 and GEP and first and second pads PAD1 and PAD2 to be described later.

Figure 10:
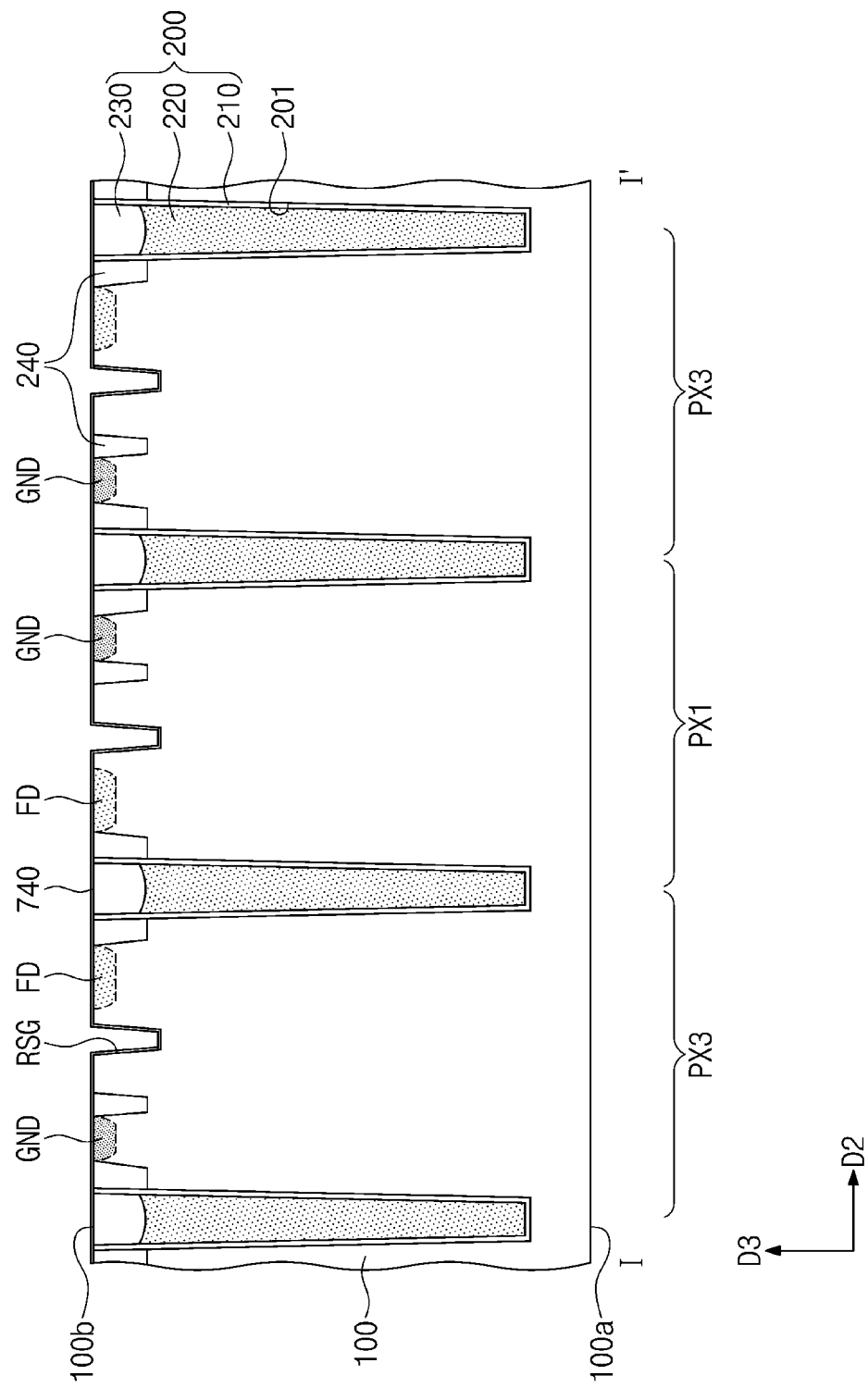

Referring to FIGS. 5 and 10, recess regions RSG may be formed by patterning the second surface 100b of the first substrate 100. The recess region RSG in each of the first to fourth pixel regions PX1 to PX4 may define a position at which a buried gate pattern 700 to be described later will be formed.

A gate insulating pattern 740 may be conformally formed on the second surface 100b of the first substrate 100. In an embodiment, the gate insulating pattern 740 may include a silicon-based insulating material and/or a high-k dielectric material. The gate insulating pattern 740 may be formed to cover an inner sidewall and a bottom surface of the recess region RSG.

Figure 11:
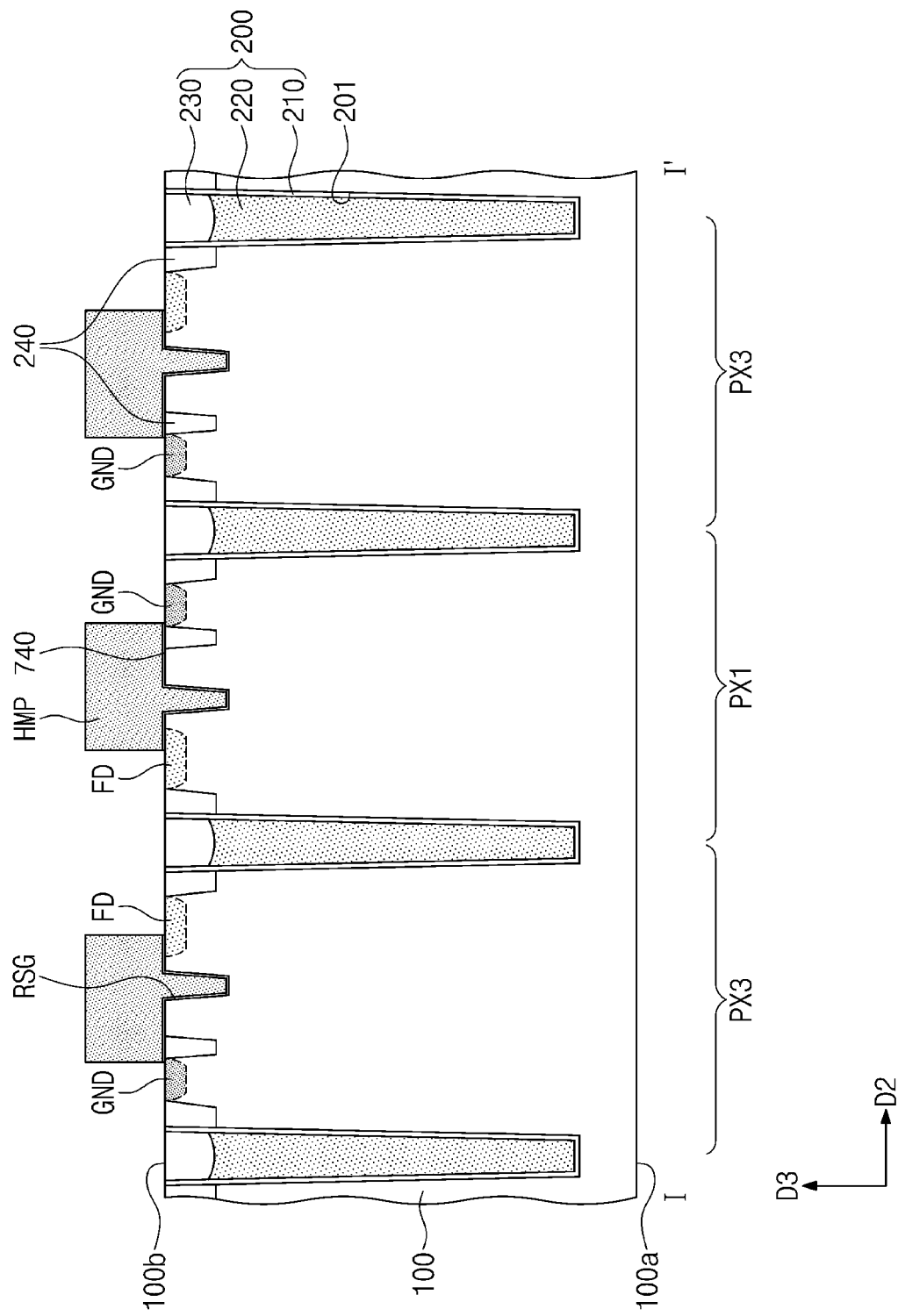

Referring to FIGS. 5 and 11, hard mask patterns HMP may be formed on the second surface 100b of the first substrate 100. The hard mask patterns HMP may be formed to expose the ground regions GND and the floating diffusion regions FD. For example, the hard mask patterns HMP expose the ground regions GND and a portion of the floating diffusion regions FD. In an embodiment, the hard mask patterns HMP may be formed using a photolithography process.

An exposed gate insulating pattern 740 may be selectively removed using the hard mask patterns HMP as etch masks. The gate insulating pattern 740 under the hard mask patterns HMP may be protected by the hard mask patterns HMP and thus may remain after an etching process is performed.

Figure 12:
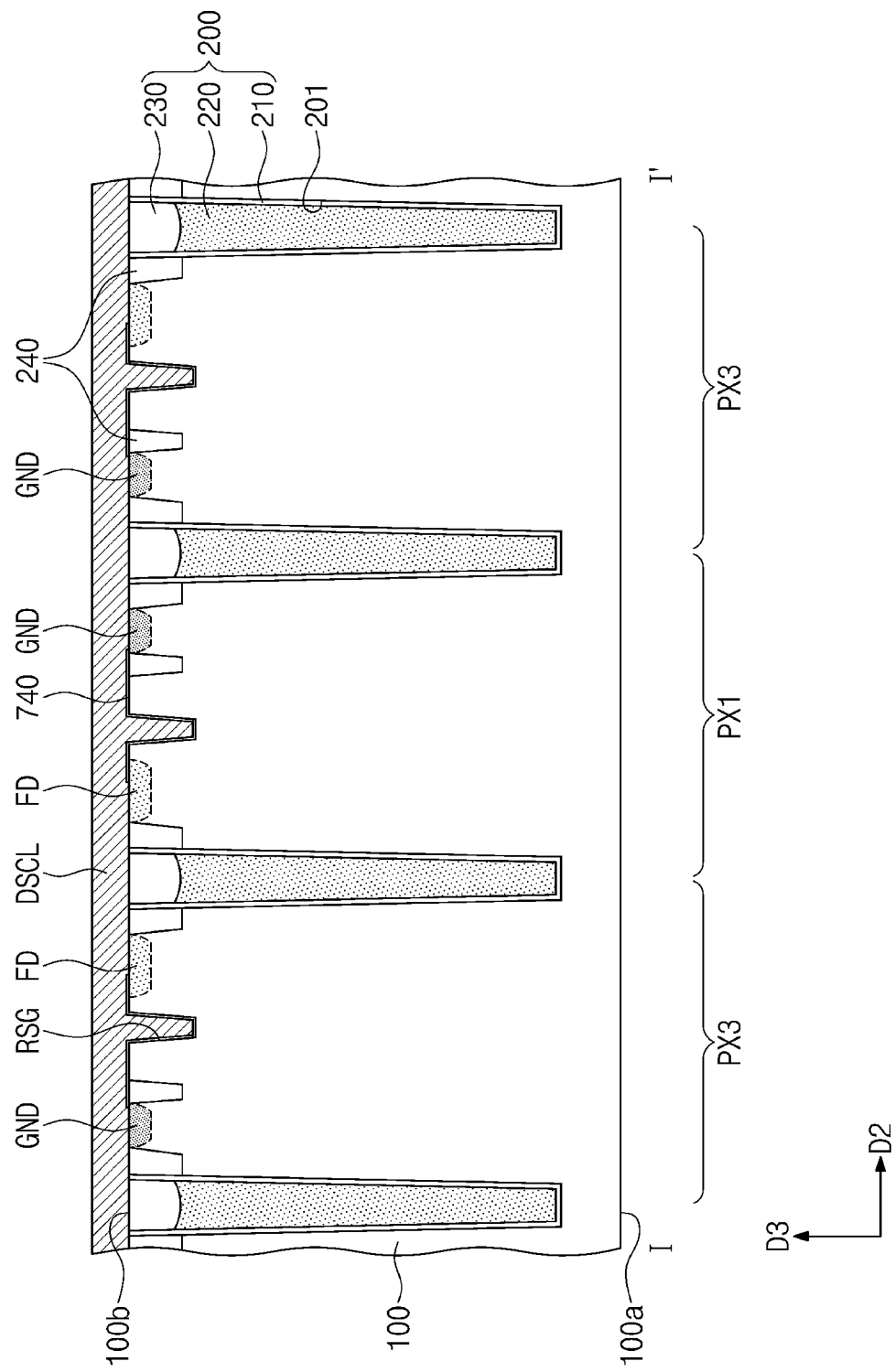

Referring to FIGS. 5 and 12, the hard mask patterns HMP may be selectively removed. A conductive layer DSCL may be formed on the second surface 100b of the first substrate 100. The conductive layer DSCL may be formed to completely fill the recess regions RSG. In an embodiment, the conductive layer DSCL may include a metal, a metal silicide, poly-silicon, or any combination thereof. For example, the conductive layer DSCL may include doped poly-silicon.

Figure 13:
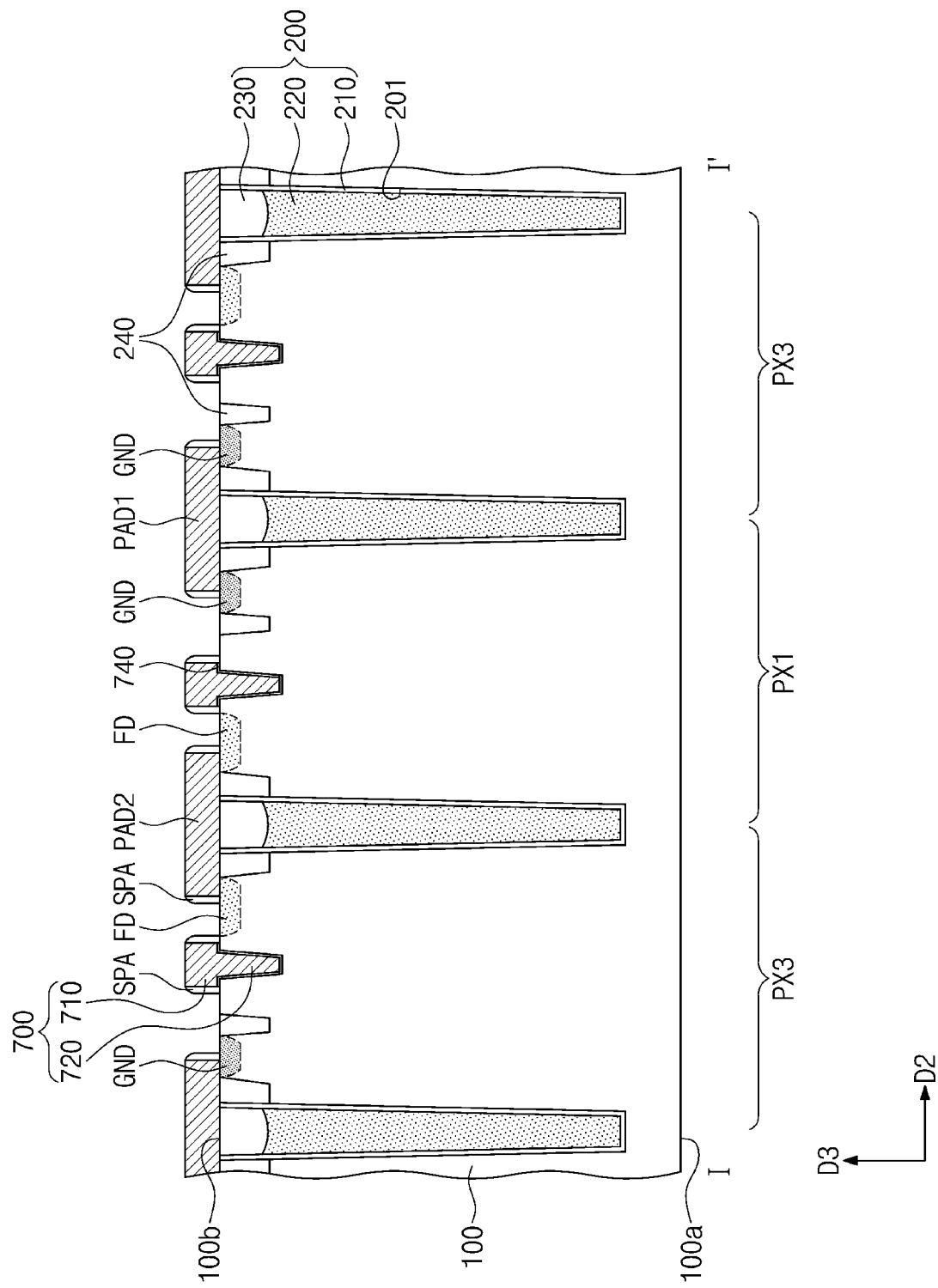

Referring to FIGS. 5 and 13, the conductive layer DSCL may be patterned to form a buried gate pattern 700, a first pad PAD1, and a second pad PAD2. In the patterning process, an exposed gate insulating pattern 740 may be removed together with a portion of the conductive layer DSCL. In an embodiment, at least one gate pattern GEP may also be formed on the active region ACT.

The first pad PAD1 may be positioned to overlap with (e.g., in the third direction D3) the ground regions GND of the first to fourth pixel regions PX1 to PX4 adjacent to each other. Since the gate insulating pattern 740 under the first pad PAD1 is removed, the first pad PAD1 may be directly connected to the ground regions GND.

The second pad PAD2 may be positioned to overlap (e.g., in the third direction D3) the floating diffusion regions FD of the first to fourth pixel regions PX1 to PX4 adjacent to each other. For example, the second pad PAD2 may be positioned to at least partially overlap (e.g., in the third direction D3) the floating diffusion regions FD of the first to fourth pixel regions PX1 to PX4. Since the gate insulating pattern 740 under the second pad PAD2 is removed, the second pad PAD2 may be directly connected to the floating diffusion regions FD.

Spacers SPA may be formed on sidewalls of the buried gate pattern 700, the first pad PAD1 and the second pad PAD2. For example, in an embodiment, the formation of the spacers SPA may include conformally forming a spacer layer on the second surface 100b of the first substrate 100, and anisotropically etching the spacer layer. However, embodiments of the present inventive concept are not limited thereto.

Figure 14:
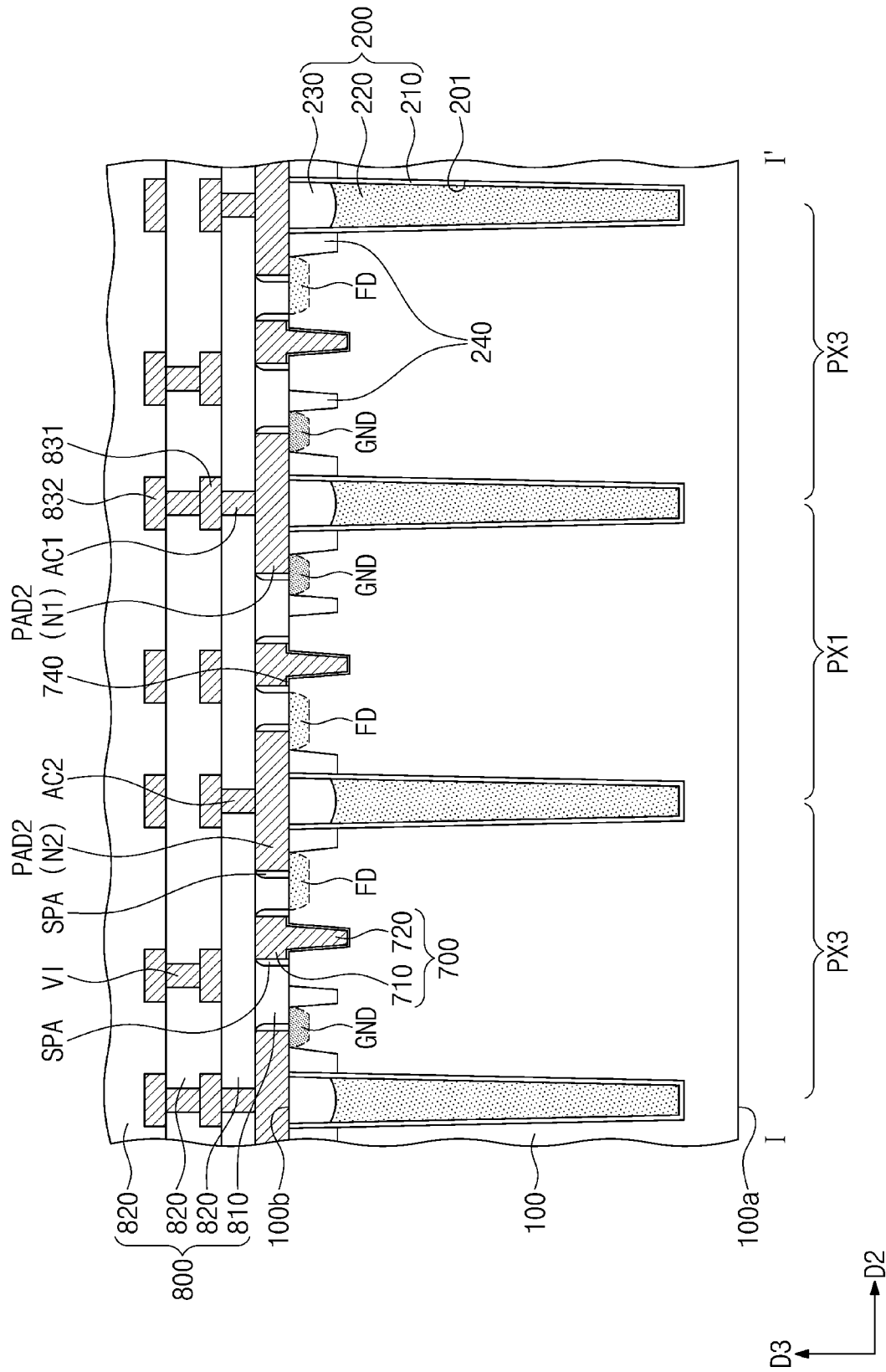

Referring to FIGS. 5 and 14, a first interconnection layer 800 may be formed on the second surface 100b of the first substrate 100. The formation of the first interconnection layer 800 may include stacking a plurality of metal layers (e.g., in the third direction D3).

For example, a first contact AC1 may be formed on the first pad PAD1, and a second contact AC2 may be formed on the second pad PAD2. First interconnection lines 831 may be formed on the first and second contacts AC1 and AC2, respectively. Vias VI may be formed on the first interconnection lines 831. Second interconnection lines 832 may be formed on the vias VI.

Figure 15:
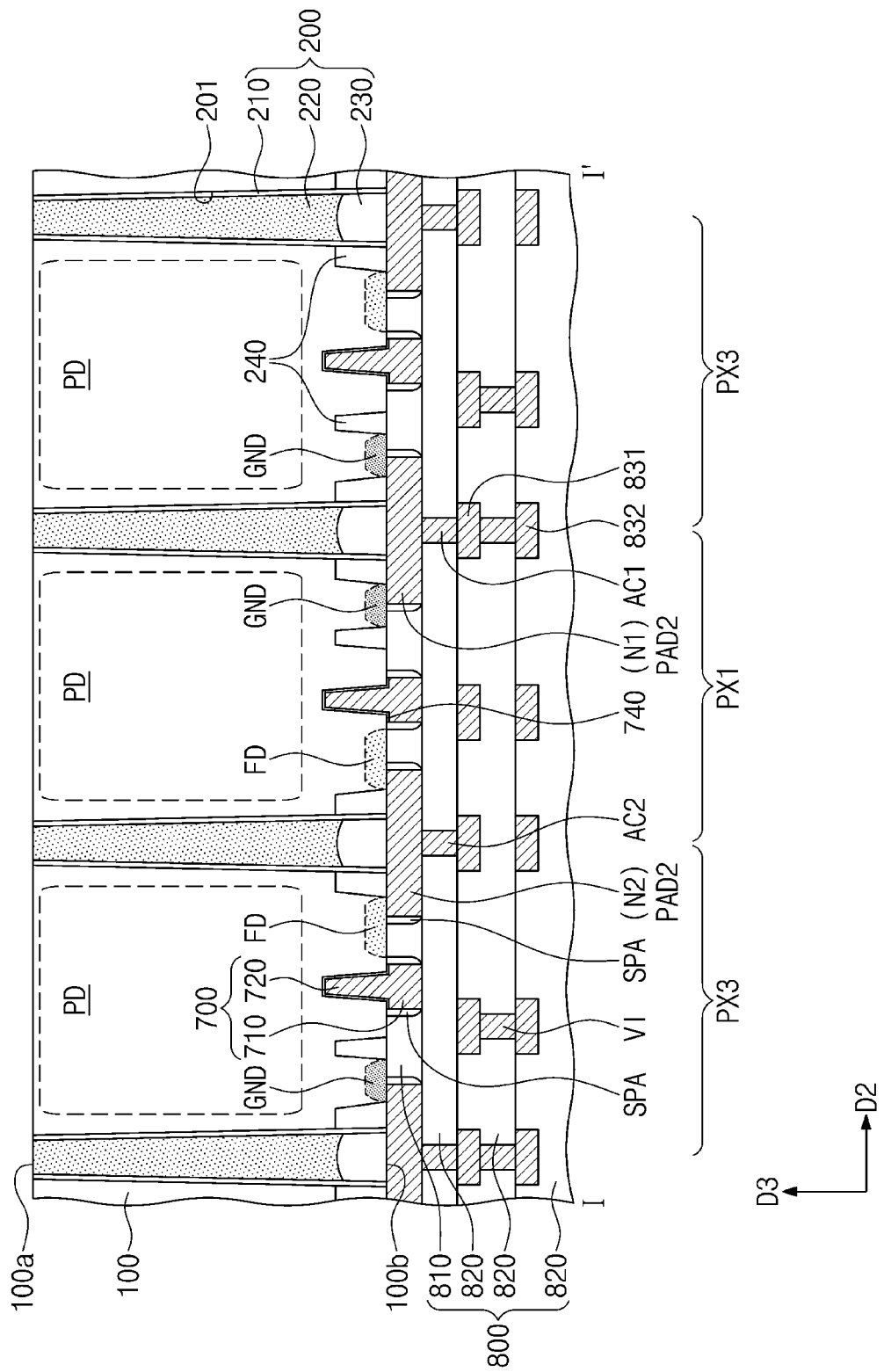

Referring to FIGS. 5 and 15, a planarization process may be performed on the first surface 100a of the first substrate 100 until the second isolation pattern 220 of the isolation pattern 200 is exposed. Thus, a thickness of the first substrate 100 (e.g., length in the third direction D3) may be reduced. A height of the isolation pattern 200 may be substantially equal to the thickness of the first substrate 100. Dopants may be injected into the first to fourth pixel regions PX1 to PX4 to form photoelectric conversion regions PD in the first to fourth pixel regions PX1 to PX4, respectively. In an embodiment, the photoelectric conversion regions PD may have the second conductivity type (e.g., the N-type).

Referring again to FIGS. 5, 6A and 6B, an insulating layer 400 may be formed on the first surface 100a of the first substrate 100. A fence pattern 300 having a grid shape may be formed on the insulating layer 400. Color filters CF may be formed on the fence pattern 300. A micro lens layer 500 may be formed on the color filters CF.

Figure 16:
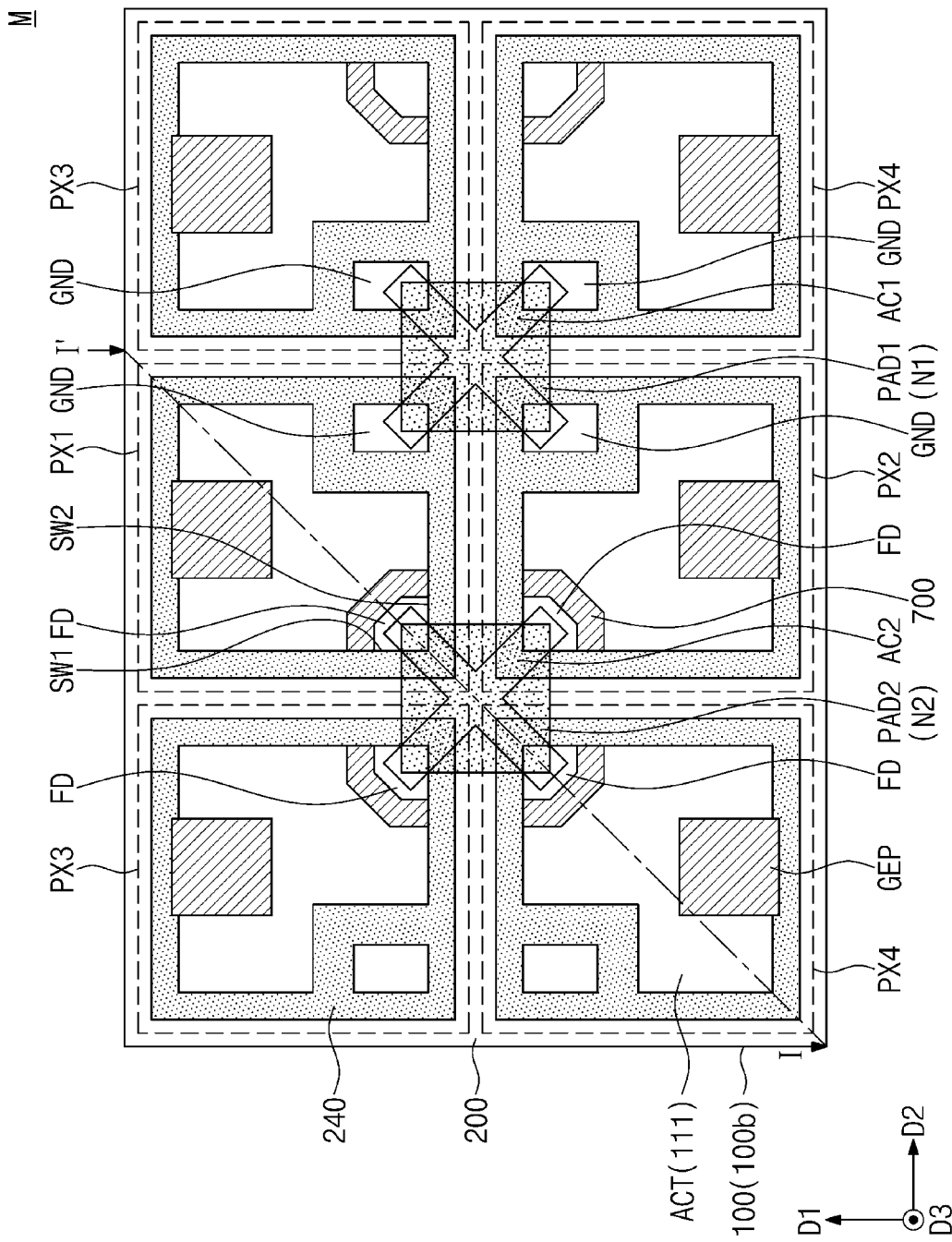
FIG. 16 is a plan view illustrating an image sensor according to according to an embodiment of the present inventive concept.

FIG. 16 is a plan view illustrating an image sensor according to some embodiments of the present inventive concept. FIG. 17 is a cross-sectional view taken along a line I-I' of FIG. 16. In the present embodiments, the descriptions of the same or similar components and technical features as in the embodiments of FIGS. 5, 6A and 6B may be omitted for the purposes of ease and convenience in explanation. For example, differences between the present embodiments and the embodiments of FIGS. 5, 6A and 6B will be mainly described hereinafter.

Referring to FIGS. 16 and 17, at least a portion of a second contact AC2 may be directly connected to the floating diffusion region FD. For example, the second contact AC2 may include an upper portion UPP on the second pad PAD2, and a first vertical extension VEP1 and a second vertical extension VEP2 which are adjacent to both sides of the second pad PAD2, respectively.

The first vertical extension VEP1 may extend (e.g., in the third direction D3) to the floating diffusion region FD of the fourth pixel region PX4 along the spacer SPA. The second vertical extension VEP2 may extend (e.g., in the third direction D3) to the floating diffusion region FD of the first pixel region PX1 along the spacer SPA. The upper portion UPP of the second contact AC2 may be connected to the second pad PAD2. For example, a lower surface of the upper portion UPP of the second contact AC2 may directly contact an upper surface of the second pad PAD2.

The second contact AC2 may be directly connected to the floating diffusion region FD of the fourth pixel region PX4 through the first vertical extension VEP1. In addition, the second contact AC2 may be electrically connected to the floating diffusion region FD of the fourth pixel region PX4 through the second pad PAD2.

The second contact AC2 may be directly connected to the floating diffusion region FD of the first pixel region PX1 through the second vertical extension VEP2. In addition, the second contact AC2 may be electrically connected to the floating diffusion region FD of the first pixel region PX1 through the second pad PAD2.

Referring again to FIG. 16, the second contact AC2 according to the present embodiment may have an X shape when viewed in a plan view (e.g., in a plane defined in the first and second directions D1, D2). Ends of the second contact AC2 may correspond to the vertical extensions and may be directly connected to the floating diffusion regions FD of the first to fourth pixel regions PX1 to PX4, respectively. As a result, according to the present embodiment, the floating diffusion regions FD may be directly connected to the second contact AC2 as well as the second pad PAD2, and thus an electrical resistance between the first interconnection line 831 and the floating diffusion regions FD may be reduced. Accordingly, a signal processing speed of the image sensor may be increased.

A first contact AC1 may have substantially the same shape as the second contact AC2. For example, the ground regions GND of the first to fourth pixel regions PX1 to PX4 may be directly connected to the first contact AC1 as well as the first pad PAD1.

Figure 18:
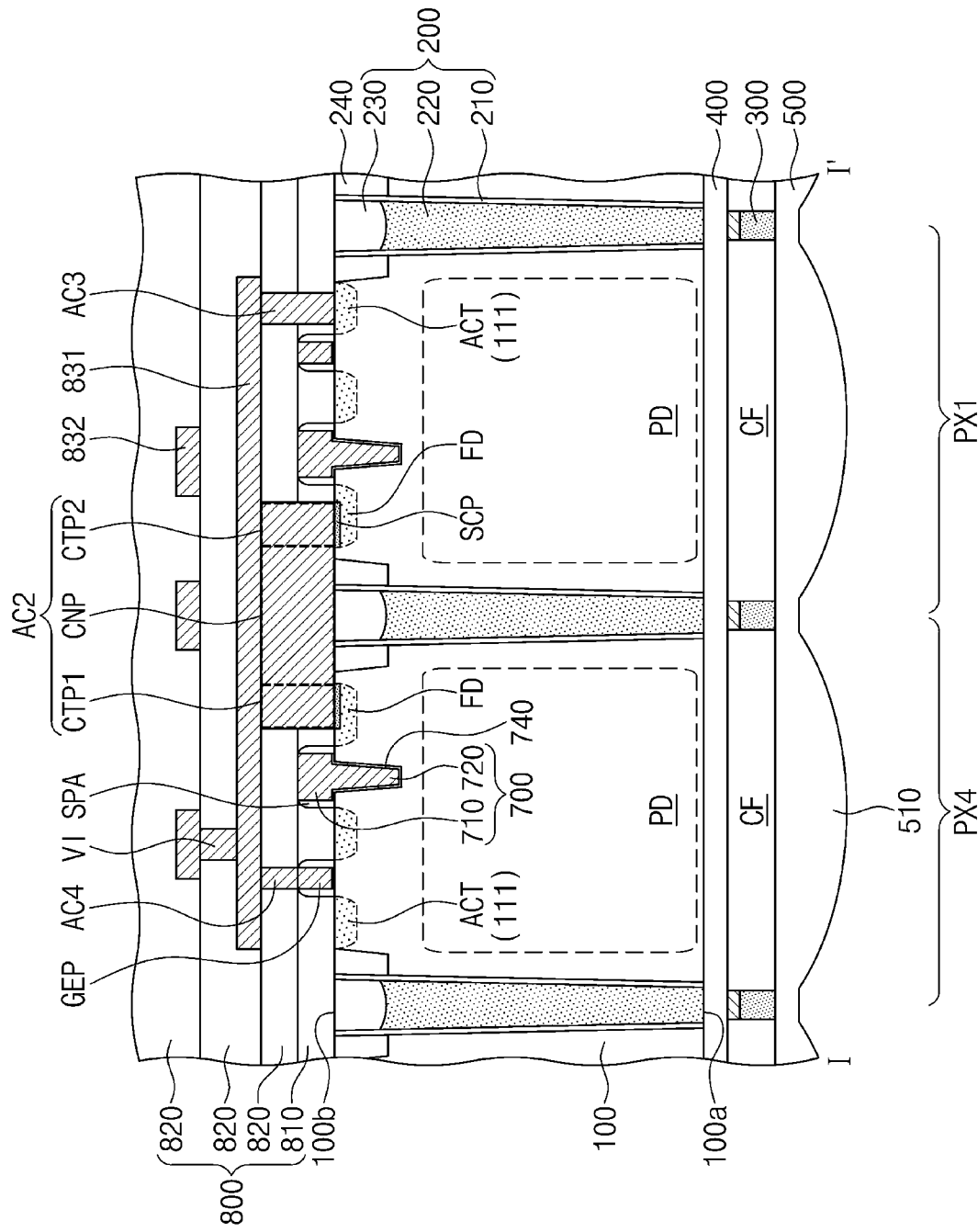
FIG. 18 is a cross-sectional view taken along the line I-I' of FIG. 16 illustrating an image sensor according to some embodiments of the present inventive concept.

FIG. 18 is a cross-sectional view taken along the line I-I' of FIG. 16 to illustrate an image sensor according to some embodiments of the present inventive concept. In the present embodiment, the descriptions to the same or similar technical features as in the embodiments of FIGS. 16 and 17 may be omitted for the purposes of ease and convenience in explanation. For example, differences between the present embodiments and the embodiments of FIGS. 16 and 17 will be mainly described hereinafter.

Referring to FIGS. 16 and 18, the first and second pads PAD1 and PAD2 may be omitted. For example, a second contact AC2 may be directly connected to the floating diffusion regions FD of the first to fourth pixel regions PX1 to PX4. For example, the second contact AC2 may include a first contact portion CTP1, a second contact portion CTP2, and a connection portion CNP between the first and second contact portions CTP1 and CTP2. The first contact portion CTP1 may be connected to the floating diffusion region FD of the fourth pixel region PX4, and the second contact portion CTP2 may be connected to the floating diffusion region FD of the first pixel region PX1. The connection portion CNP may be provided on the device isolation pattern 240 to connect the first contact portion CTP1 and the second contact portion CTP2.

A metal silicide layer SCP may be disposed between the first contact portion CTP1 and the floating diffusion region FD of the fourth pixel region PX4 (e.g., in the third direction D3). The first contact portion CTP1 and the floating diffusion region FD of the fourth pixel region PX4 may be electrically connected to each other through the metal silicide layer SCP. The metal silicide layer SCP may also be provided between the second contact portion CTP2 and the floating diffusion region FD of the first pixel region PX1 (e.g., in the third direction D3) for electrical connection therebetween.

A planar shape of the second contact AC2 according to the present embodiment may be substantially the same as the planar shape of the second contact AC2 of FIG. 16. However, embodiments of the present inventive concept are not limited thereto.

Figure 19:
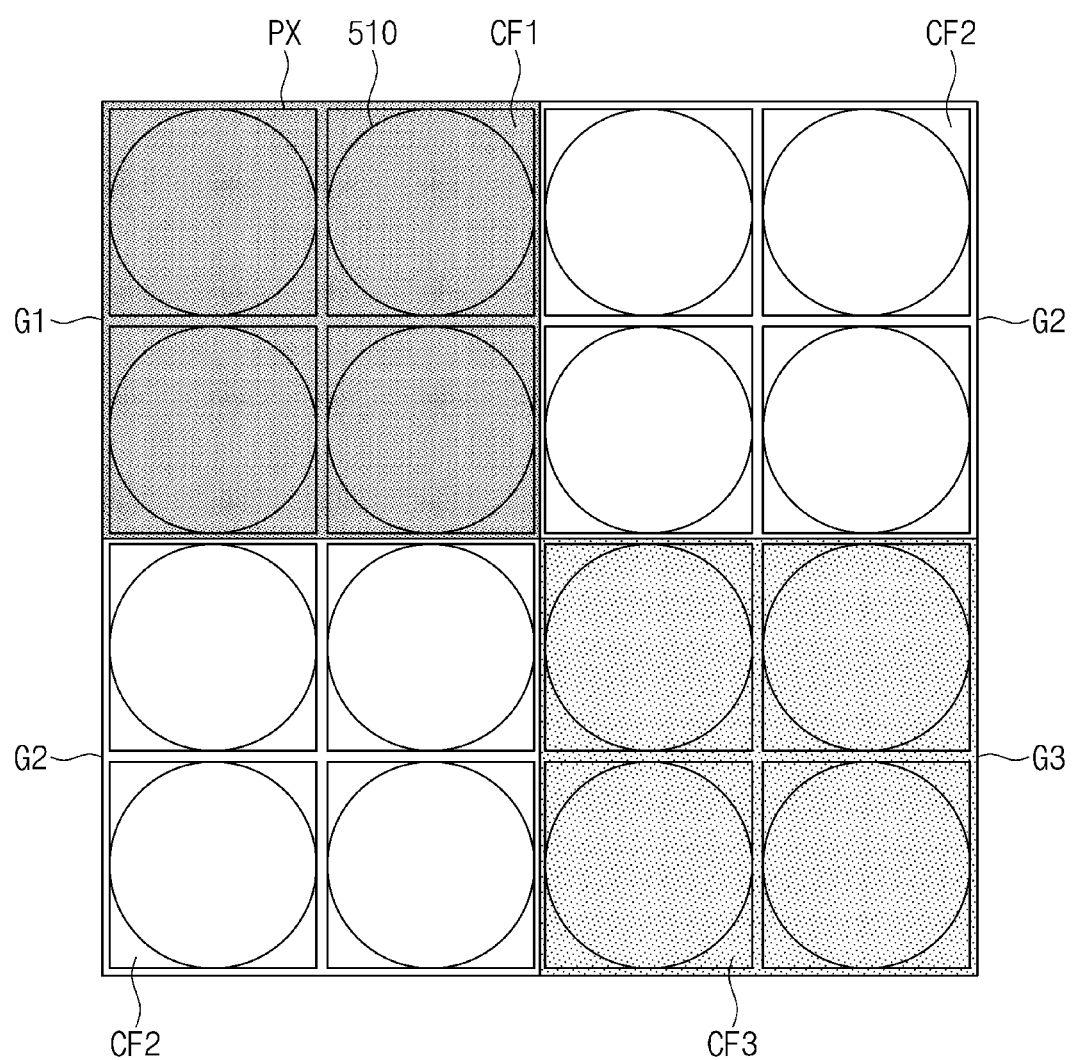
FIGS. 19, 20 and 21 are plan views illustrating pixels of image sensors according to some embodiments of the present inventive concept.
Figure 20:
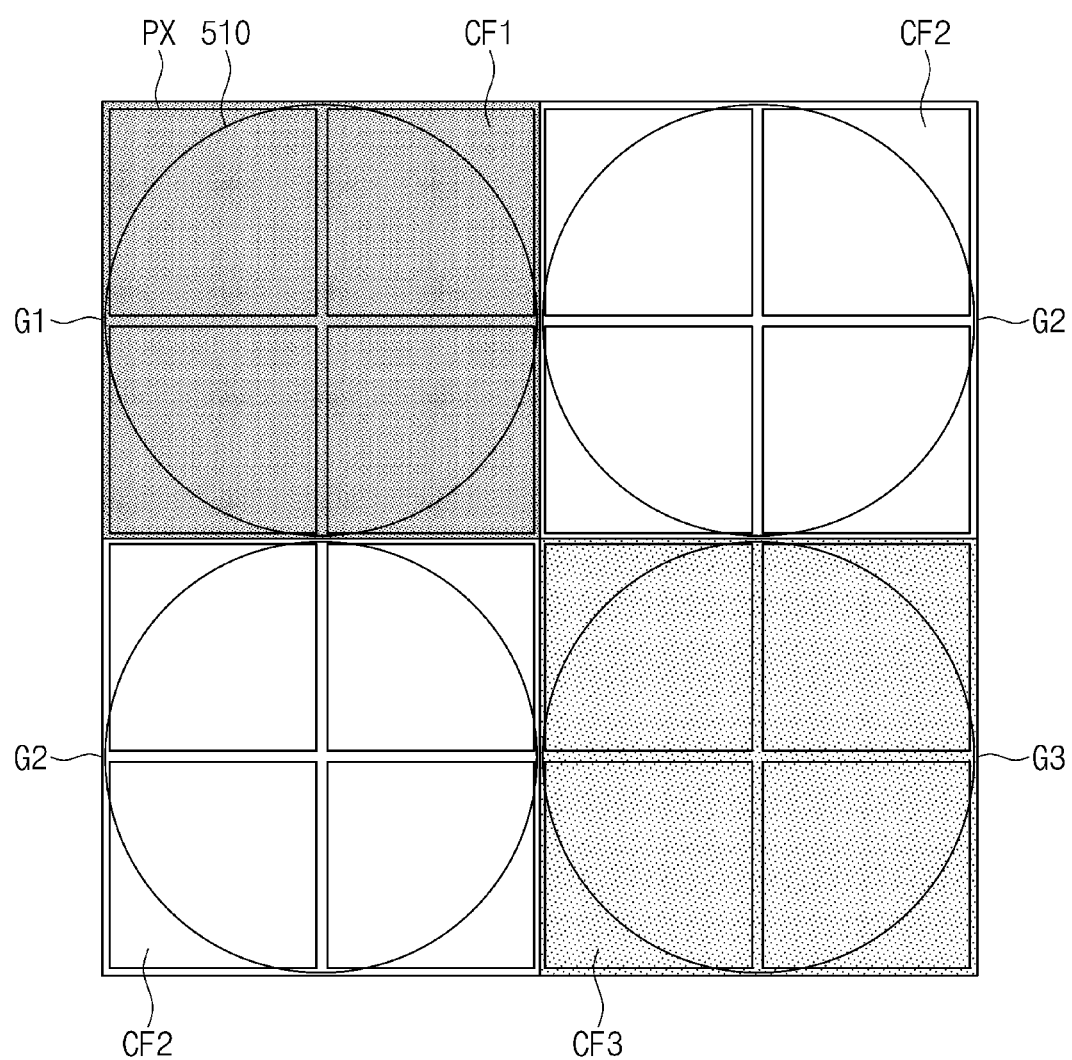
Figure 21:
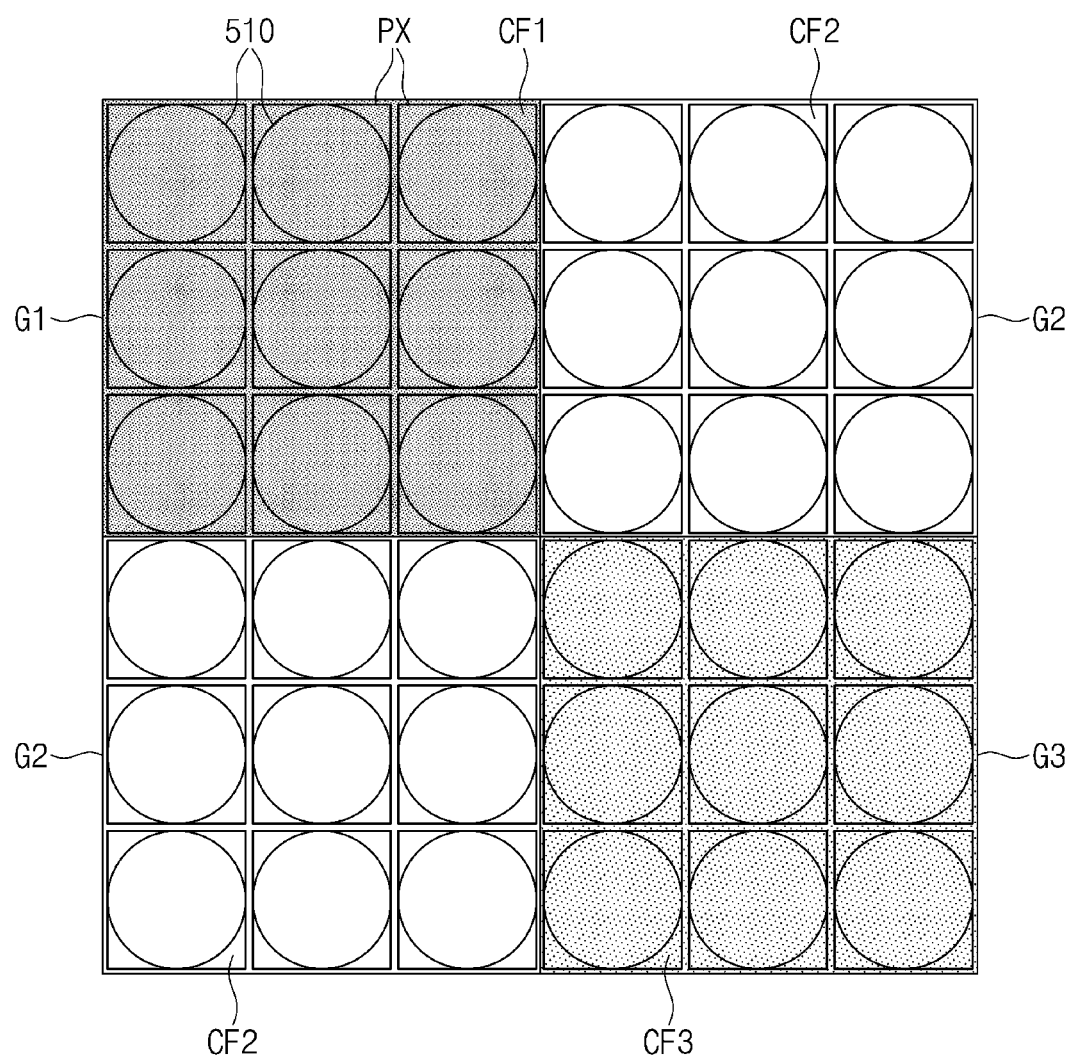

FIGS. 19, 20 and 21 are plan views illustrating pixels of image sensors according to some embodiments of the present inventive concept.

Referring to FIG. 19, first to third pixel groups G1, G2 and G3 may be provided on the first surface 100a of the first substrate 100. The first pixel group G1 may sense first light, the second pixel groups G2 may sense second light, and the third pixel group G3 may sense third light.

In an embodiment, each of the first to third pixel groups G1, G2 and G3 may include N×M pixel regions PX in an N×M array. The N and the M may be each independently an integral number greater than 1. For example, as shown in the embodiment of FIG. 20, each of the N and the M may be 2, and the image sensor may have a pixel array of a 2×2 tetra structure. However, embodiments of the present inventive concept are not limited thereto. For example, in some embodiments, the N may be greater than the M. In an embodiment, the N may be a number of rows and the M may be a number of columns.

The first pixel group G1 may include a first color filter CF1, each of the second pixel groups G2 may include a second color filter CF2, and the third pixel group G3 may include a third color filter CF3. For example, in an embodiment, the first color filter CF1 may be a red color filter, the second color filter CF2 may be a green color filter, and the third color filter CF3 may be a blue color filter. However, embodiments of the present inventive concept are not limited thereto.

The micro lenses 510 may be disposed on each of the first to third color filters CF1, CF2 and CF3. One micro lens 510 may be disposed on one pixel region PX. Thus, each of the first to third pixel groups G1, G2 and G3 may include the micro lenses 510 in a 2×2 array.

Referring to FIG. 20, each of the first to third pixel groups G1, G2 and G3 may include one micro lens 510. For example, the one micro lens 510 may be provided on the 2×2 pixel regions PX of each of the first to third pixel groups G1, G2 and G3. The micro lens 510 may cover the 2×2 pixel regions PX.

Referring to FIG. 21, each of the first to third pixel groups G1, G2 and G3 may include N M pixel regions PX in an N×M array. For example, as shown in the embodiment of FIG. 21, each of the N and the M may be 3, and the image sensor may have a pixel array of a 3×3 Nona structure. However, embodiments of the present inventive concept are not limited thereto.

Figure 22:
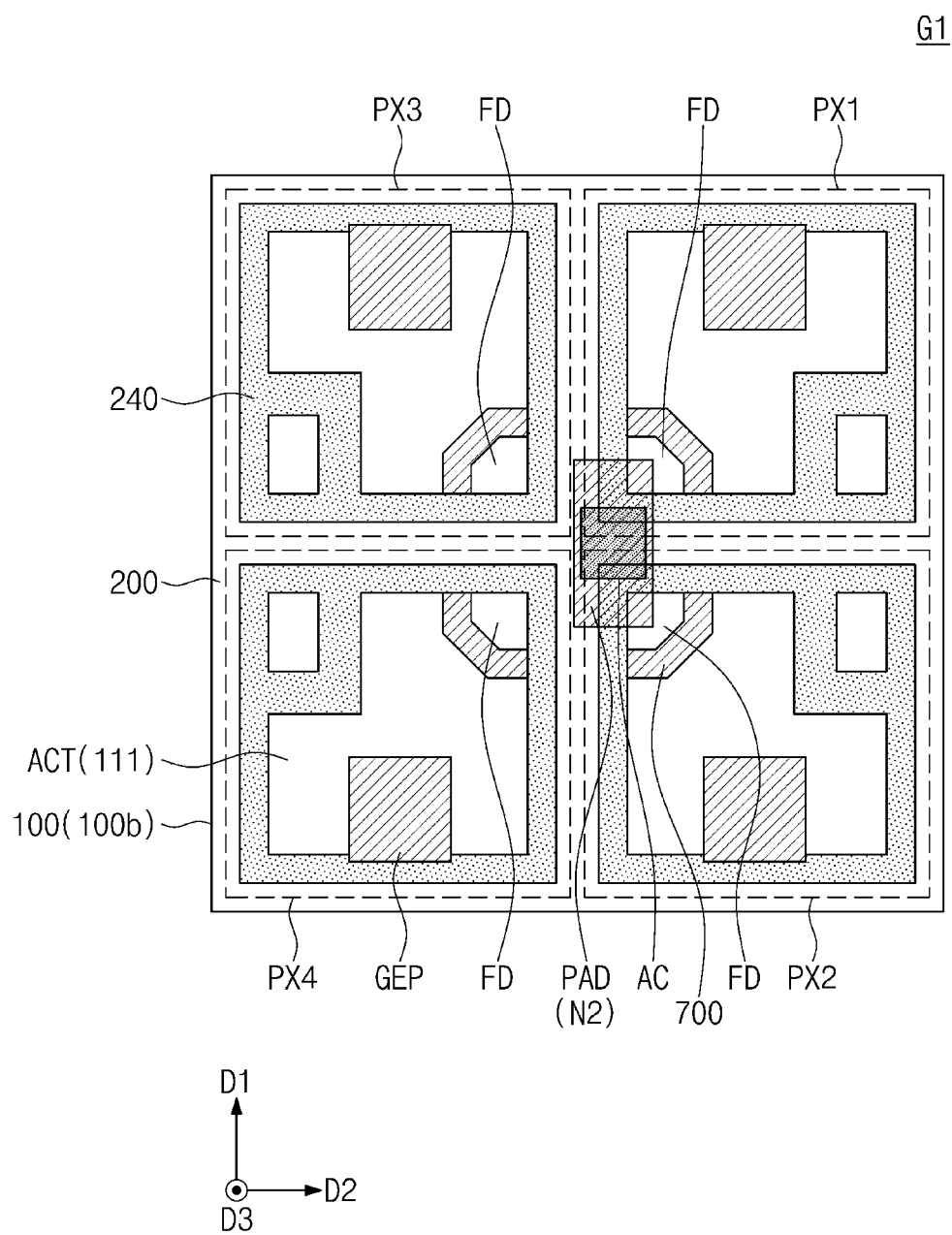
FIGS. 22 and 23 are plan views illustrating the pixels of the image sensor of FIG. 19 or 20 according to some embodiments of the present inventive concept.
Figure 23:
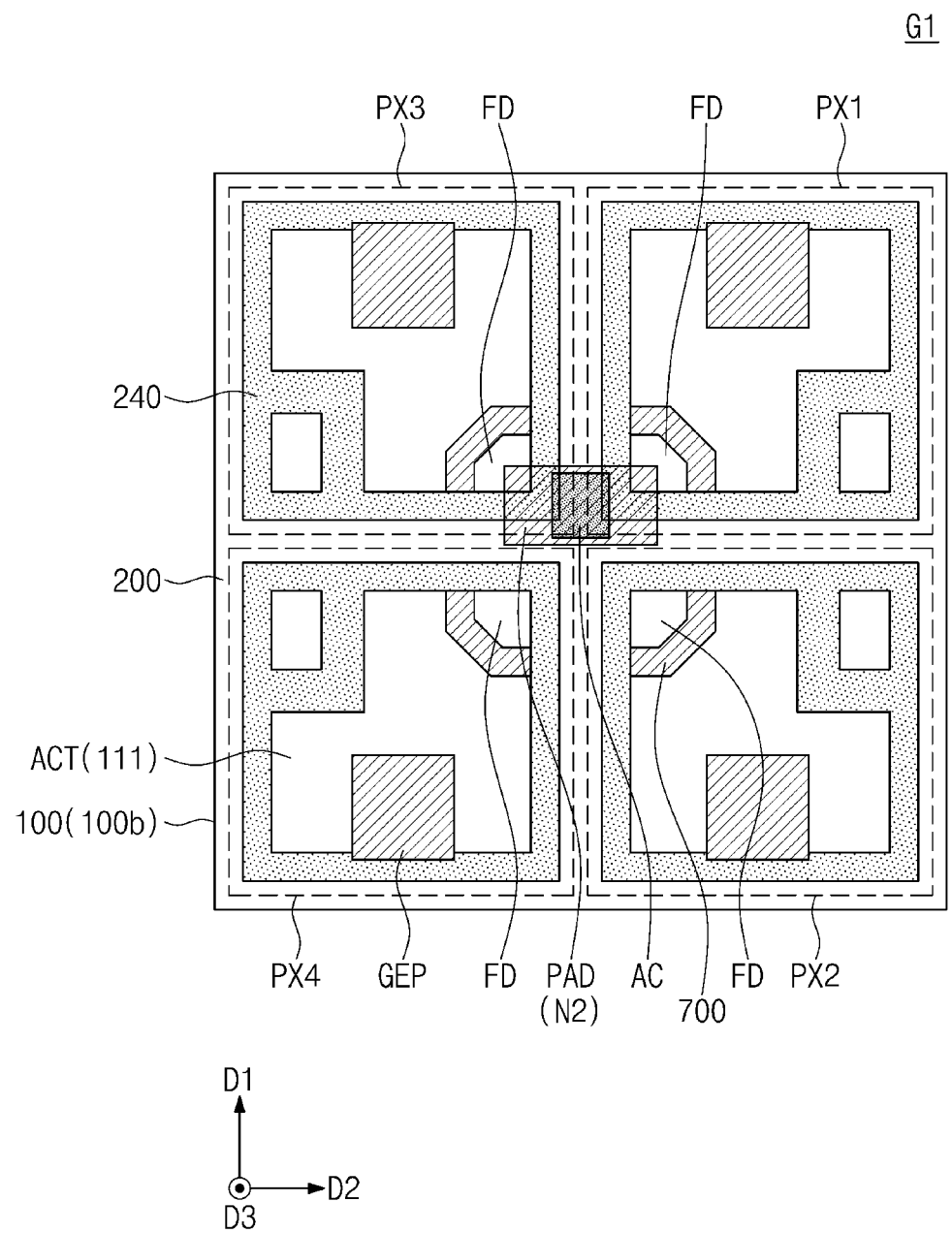

FIGS. 22 and 23 are plan views illustrating the pixels of the image sensor of FIG. 19 or 20.

Referring to FIG. 22, the first pixel group G1 having a pixel array of the 2×2 pixel regions PX is illustrated. The 2×2 pixel regions PX may include first to fourth pixel regions PX1 to PX4. Each of the first to fourth pixel regions PX1 to PX4 may include a floating diffusion region FD.

In an embodiment, a pad PAD may be disposed on at least two of the floating diffusion regions FD of the first to fourth pixel regions PX1 to PX4. A contact AC connecting the pad PAD and an interconnection line may be disposed on the pad PAD.

For example, as shown in the embodiment of FIG. 22, the pad PAD may be disposed on the first and second pixel regions PX1 and PX2, adjacent to each other in the first direction D1, of the first to fourth pixel regions PX1 to PX4. However, embodiments of the present inventive concept are not limited thereto. The first pixel region PX1 and the second pixel region PX2 may be adjacent to each other in a column direction. The pad PAD may be disposed on and may directly contact the floating diffusion regions FD of the first and second pixel regions PX1 and PX2. For example, the pad PAD according to the embodiment shown in FIG. 22 may be connected in common to the floating diffusion regions FD of the first and second pixel regions PX1 and PX2.

Other features of the pad PAD and the contact AC may be substantially the same as corresponding features of the second pad PAD2 and the second contact AC2 described with reference to FIGS. 5, 6A and 6B.

Referring to FIG. 23, a pad PAD may be disposed on at least two of the floating diffusion regions FD of the first to fourth pixel regions PX1 to PX4. A contact AC connecting the pad PAD and an interconnection line may be disposed on the pad PAD. For example, the pad PAD may be disposed on the first and third pixel regions PX1 and PX3, adjacent to each other in the second direction D2, of the first to fourth pixel regions PX1 to PX4. The first pixel region PX1 and the third pixel region PX3 may be adjacent to each other in a row direction. The pad PAD according to the embodiment shown in FIG. 23 may be connected in common to the floating diffusion regions FD of the first and third pixel regions PX1 and PX3.

Figure 24:
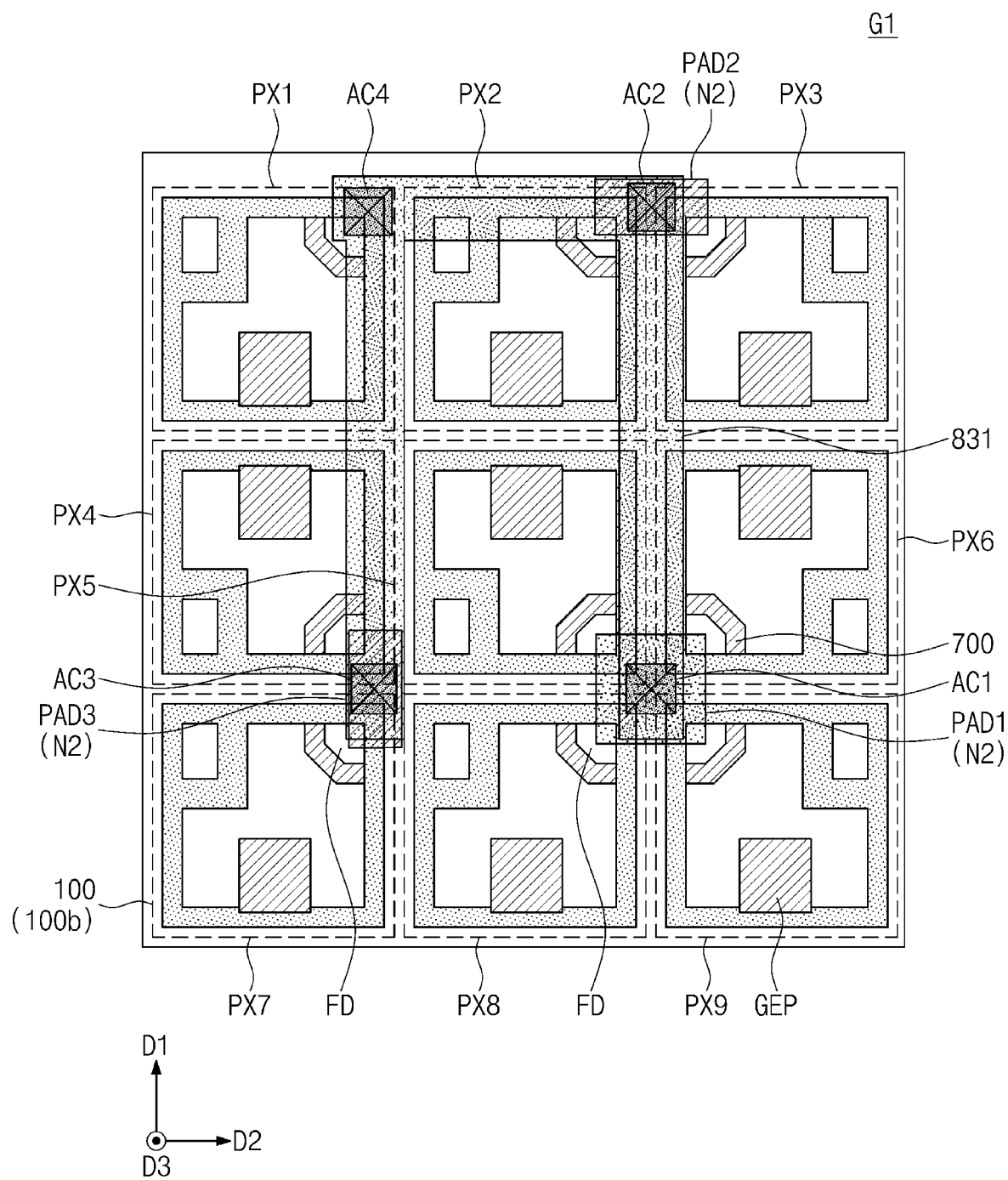
FIG. 24 is a plan view illustrating the pixels of the image sensor of FIG. 21 according to an embodiment of the present inventive concept.

FIG. 24 is a plan view illustrating the pixels of the image sensor of FIG. 21.

Referring to FIG. 24, the first pixel group G1 having a pixel array of the 3×3 pixel regions PX is illustrated. The 3×3 pixel regions PX may include first to ninth pixel regions PX1 to PX9. Each of the first to ninth pixel regions PX1 to PX9 may include a floating diffusion region FD.

For example, a first pad PAD1 may be disposed on the floating diffusion regions FD of the fifth, sixth, eighth and ninth pixel regions PX5, PX6, PX8 and PX9. The first pad PAD1 may be connected in common to the floating diffusion regions FD of the fifth, sixth, eighth and ninth pixel regions PX5, PX6, PX8 and PX9. In an embodiment, a shape of the first pad PAD1 may be the same as that of the second pad PAD2 illustrated in FIG. 5. In an embodiment, the first pad PAD1 may be connected to a first interconnection line 831 through a first contact AC1.

A second pad PAD2 may be disposed on the floating diffusion regions FD of the second and third pixel regions PX2 and PX3. The second pad PAD2 may be connected in common to the floating diffusion regions FD of the second and third pixel regions PX2 and PX3. In an embodiment, a shape of the second pad PAD2 may be the same as that of the pad PAD illustrated in FIG. 23. In an embodiment, the second pad PAD2 may be connected to the first interconnection line 831 through a second contact AC2.

A third pad PAD3 may be disposed on the floating diffusion regions FD of the fourth and seventh pixel regions PX4 and PX7. The third pad PAD3 may be connected in common to the floating diffusion regions FD of the fourth and seventh pixel regions PX4 and PX7. In an embodiment, a shape of the third pad PAD3 may be the same as that of the pad PAD illustrated in FIG. 22. In an embodiment, the third pad PAD3 may be connected to the first interconnection line 831 through a third contact AC3.

In an embodiment, a pad may be omitted on the floating diffusion region FD of the first pixel region PX1. A fourth contact AC4 may be disposed directly on the floating diffusion region FD of the first pixel region PX1. In an embodiment, the floating diffusion region FD of the first pixel region PX1 may be connected to the first interconnection line 831 through the fourth contact AC4.

The pad according to the present inventive concept may be connected in common to two to four floating diffusion regions FD adjacent to each other. The pad according to the present inventive concept may be applied to, but not limited to, 1×3 pixels or 2×4 pixels as well as the 2×2 pixels and the 3×3 pixels described above.

The image sensor according to the present inventive concept may include the pad connecting the floating diffusion regions or the ground regions of the adjacent pixels in common. Due to the pad, the degree of freedom of the interconnection routing of the image sensor may be increased, a leakage current through a contact may be prevented, and the integration density of the pixels may be increased. In addition, the image sensor according to the present inventive concept may reduce the capacitance of the floating diffusion region, and thus the performance of the image sensor may be increased.

While the present inventive concept has been described with reference to example embodiments, it will be apparent to those skilled in the art that various changes and modifications may be made without departing from the spirit and scope of the present inventive concept. Therefore, it should be understood that the above embodiments are not limiting, but illustrative, and shall not be restricted or limited by the foregoing description.

What is claimed is:

1. An image sensor comprising:
a first floating diffusion region;
a second floating diffusion region adjacent to the first floating diffusion region in a first direction;
a third floating diffusion region adjacent to the first floating diffusion region in a second direction, the second direction perpendicular to the first direction;
a fourth floating diffusion region adjacent to the second floating diffusion region in the second direction;
a pad disposed directly on the first and second floating diffusion regions, the pad at least partially overlapping the first and second floating diffusion regions;
an interconnection line; and
a first contact connecting the pad to the interconnection line,
wherein a first surface of the pad is disposed on the first floating diffusion region and the second floating diffusion region, and
wherein a device isolation pattern defines the first, second, third and fourth floating diffusion regions.

2. The image sensor of claim 1, wherein the first surface is also disposed on each of the third and fourth floating diffusion regions.

3. The image sensor of claim 1, further comprising:
a first micro lens covering the first floating diffusion region;
a second micro lens covering the second floating diffusion region;
a third micro lens covering the third floating diffusion region; and
a fourth micro lens covering the fourth floating diffusion region.

4. The image sensor of claim 1, further comprising:
one micro lens covering the first, second, third and fourth floating diffusion regions.

5. The image sensor of claim 1, further comprising:
a pixel array including a plurality of pixels arranged along N rows and M columns,
wherein each of the N and the M is an integral number greater than 1, and wherein the pixels comprise the first, second, third and fourth floating diffusion regions, respectively.

6. The image sensor of claim 5, wherein the first direction is a row direction.

7. The image sensor of claim 5, wherein the first direction is a column direction.

8. The image sensor of claim 1, further comprising:
a buried gate pattern adjacent to the first floating diffusion region,
wherein the pad includes a same material as the buried gate pattern.

9. The image sensor of claim 8, wherein:
the device isolation pattern includes a first sidewall and a second sidewall that define the first floating diffusion region when viewed in a plan view,
wherein the buried gate pattern extends from the first sidewall to the second sidewall when viewed in the plan view, and
wherein the first floating diffusion region has an island shape surrounded by the first sidewall, the second sidewall and the buried gate pattern when viewed in the plan view.

10. The image sensor of claim 1, further comprising:
an active region adjacent to the first floating diffusion region; and
a second contact connecting the active region to the interconnection line.

* * * * *